(12) United States Patent
Chou et al.

(10) Patent No.: US 8,591,989 B2
(45) Date of Patent: Nov. 26, 2013

(54) SICN FILM FORMATION METHOD AND APPARATUS

(75) Inventors: Pao-Hwa Chou, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/552,844

(22) Filed: Jul. 19, 2012

(65) Prior Publication Data

US 2012/0282418 A1 Nov. 8, 2012

Related U.S. Application Data

(63) Continuation of application No. 12/068,974, filed on Feb. 13, 2008, now abandoned.

(30) Foreign Application Priority Data

Feb. 16, 2007 (JP) .................................. 2007-037112
Jan. 8, 2008 (JP) .................................. 2008-001689

(51) Int. Cl.
  *C23C 16/36* (2006.01)
  *C23C 16/52* (2006.01)
(52) U.S. Cl.
  USPC ................. 427/249.15; 427/248.1; 427/249.1
(58) Field of Classification Search
  None
  See application file for complete search history.

(56) References Cited

U.S. PATENT DOCUMENTS

| 5,874,368 A | 2/1999 | Laxman et al. |
| 6,165,916 A | 12/2000 | Muraoka et al. |
| 6,579,374 B2 | 6/2003 | Bondestam et al. |
| 7,462,376 B2 | 12/2008 | Kato et al. |
| 7,462,571 B2 | 12/2008 | Hasebe et al. |
| 2003/0108674 A1* | 6/2003 | Chung et al. ........... 427/255.394 |
| 2005/0095770 A1 | 5/2005 | Kumagai et al. |
| 2005/0155551 A1 | 7/2005 | Bae et al. |
| 2005/0205206 A1 | 9/2005 | Lembersky |
| 2006/0150905 A1 | 7/2006 | Sakai et al. |

(Continued)

FOREIGN PATENT DOCUMENTS

| CN | 1881541 A | 12/2006 |
| JP | 2-93071 | 4/1990 |

(Continued)

OTHER PUBLICATIONS

Chinese Office Action issued on Jan. 19, 2011 for Application No. 200810080431.8 (with English language translation).

(Continued)

*Primary Examiner* — Joseph Miller, Jr.
(74) *Attorney, Agent, or Firm* — Oblon, Spivak, McClelland, Maier & Neustadt, L.L.P.

(57) ABSTRACT

A method for forming an SiCN film on target substrates placed in a process field inside a process container repeats a unit cycle a plurality of times to laminate thin films respectively formed, thereby forming the SiCN film with a predetermined thickness. The unit cycle includes performing and suspending supply of a silicon source gas, a nitriding gas, and a carbon hydride gas respectively from first, second, and third gas distribution nozzles to the process field. The unit cycle does not turn any one of the gases into plasma but heats the process field to a set temperature of 300 to 700° C. with the supply of the carbon hydride gas performed for a time period in total longer than that of the supply of the silicon source gas, so as to provide the SiCN film with a carbon concentration of 15.2% to 28.5%.

8 Claims, 24 Drawing Sheets

(56) References Cited

U.S. PATENT DOCUMENTS

2006/0205231 A1  9/2006  Chou et al.
2006/0286817 A1  12/2006 Kato et al.
2007/0167028 A1  7/2007  Chou et al.

FOREIGN PATENT DOCUMENTS

| JP | 6-45256 | 2/1994 |
|---|---|---|
| JP | 2003-179054 | 6/2003 |
| JP | 2006-287194 | 10/2006 |
| JP | 2006-287195 | 10/2006 |
| KR | 10-2006-0015708 | 2/2006 |
| WO | 2004/105115 A1 | 12/2004 |

OTHER PUBLICATIONS

Japanese Office Action mailed on Aug. 30, 2011 for Application No. 2008-001689 (with English translation).
Korean Office Action issued on Dec. 22, 2011 for Application No. 10-2008-0013866 (with English translation).

* cited by examiner

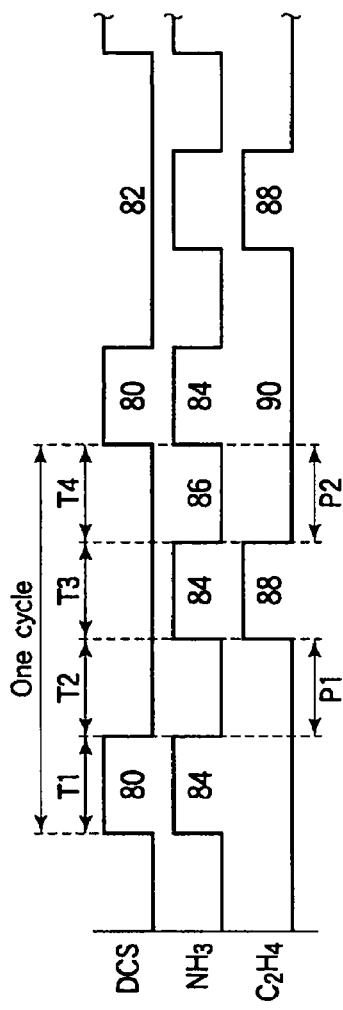
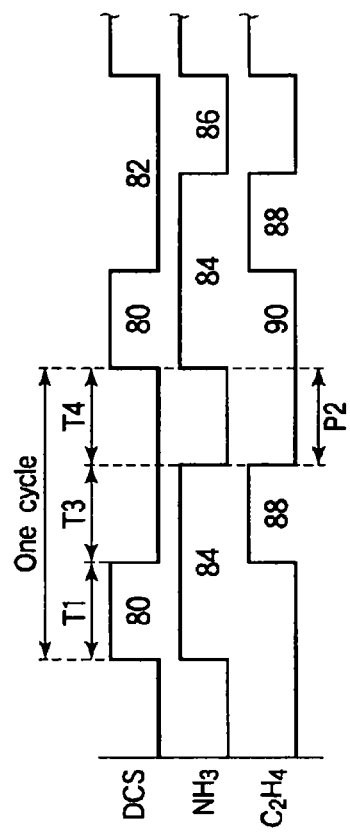
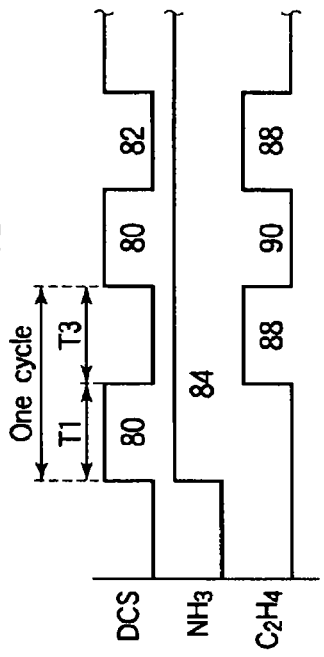
FIG.11A
FIG.11B
FIG.11C

SICN FILM FORMATION METHOD AND APPARATUS

CROSS-REFERENCE TO RELATED APPLICATIONS

The present application is a continuation of and claims the benefit of priority from U.S. application Ser. No. 12/068,974, filed Feb. 13, 2008, the entire contents of which are incorporated herein by reference. U.S. application Ser. No. 12/068,974 is based upon and claims the benefit of priority from Japanese Applications 2007-037112, filed Feb. 16, 2007 and 2008-001689, filed Jan. 8, 2008.

BACKGROUND OF THE INVENTION

1. Field of the Invention

The present invention relates to a film formation method and apparatus for forming an SiCN film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. US 2006/0286817 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), and SOG (Spin On Glass), $Si_3N_4$ (silicon nitride). Particularly, silicon nitride films are widely used, because they have better insulation properties as compared to silicon oxide films, and they can sufficiently serve as etching stopper films or inter-level insulating films.

Several methods are known for forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachloro-disilane (HCD: $Si_2Cl_6$), or bistertialbutylaminosilane (BTBAS: $SiH_2(NH(C_4H_9))_2$), is used as a silicon source gas. For example, a silicon nitride film is formed by thermal CVD using a gas combination of $SiH_2Cl_2$+$NH_3$ (see U.S. Pat. No. 5,874,368 A) or $Si_2Cl_6$+$NH_3$.

In recent years, owing to the demands for increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, as a film formation process derived from CVD (Chemical Vapor Deposition), there is a method that performs film formation while intermittently supplying a source gas and so forth to repeatedly form layers each having an atomic or molecular level thickness, one by one, or several by several (for example, Jpn. Pat. Appln. KOKAI Publications No. 2-93071 and No. 6-45256 and U.S. Pat. No. 6,165,916 A). In general, this film formation method is called ALD (Atomic Layer Deposition) or MLD (Molecular Layer Deposition), which allows a predetermined process to be performed without exposing wafers to a very high temperature.

For example, where dichlorosilane (DCS) and $NH_3$ are supplied as a silane family gas and a nitriding gas, respectively, to form a silicon nitride film (SiN), the process is performed as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

When an insulating film as one of those described above is formed and then another thin film is formed thereon, contaminants such as organic substances and particles may have stuck to the surface of the insulating film. Accordingly, a cleaning process is performed to remove the contaminants, as needed. In this cleaning process, the semiconductor wafer is immersed in a cleaning solution, such as dilute hydrofluoric acid, to perform etching on the surface of the insulating film. Consequently, the surface of the insulating film is etched by a very small amount, thereby removing the contaminants.

Where such an insulating film is formed by CVD at a higher process temperature of, e.g., about 760° C., the etching rate of the insulating film during the cleaning process is very low. Accordingly, the insulating film is not excessively etched by cleaning, and thus the cleaning process is performed with high controllability in the film thickness. However, where a thin film having a low heat resistance is present as an underlayer, a thermal CVD process at high temperature is unsuitable.

On the other hand, where such an insulating film is formed by ALD film formation at a lower process temperature of, e.g., about 400° C., the etching rate of the insulating film during the cleaning process is relatively high. Accordingly, the insulating film may be excessively etched by cleaning, and thus the cleaning process entails lower controllability in the film thickness.

Further, a silicon nitride film may be used as an etching stopper film or inter-level insulating film. In this case, the etching rate of the silicon nitride film must be very low. However, the conventional film formation method cannot satisfy this requirement.

BRIEF SUMMARY OF THE INVENTION

An object of the present invention is to provide a method and apparatus for forming an SiC film, which can employ a relatively low process temperature in film formation, and cause the film to be etched by a low amount during a cleaning process, so that the cleaning process can be performed with high controllability in the film thickness, while allowing the film to sufficiently serve as an etching stopper film or inter-level insulating film. It should be noted that the present invention is a modification of the inventions disclosed in US 2005/095770 A1 and US 2007/167028 A1.

According to a first aspect of the present invention, there is provided a method for forming an SiCN film on a target substrate in a process field configured to be selectively supplied with a first process gas containing a silane family gas, a second process gas containing a nitriding gas, and a third process gas containing a carbon hydride gas, the method being arranged to perform a plurality of cycles to laminate thin films respectively formed by the cycles, thereby forming the SiCN film with a predetermined thickness, each of the cycles comprising: a first step of performing supply of the first process gas to the process field; a second step of performing supply of the second process gas to the process field; a third step of performing supply of the third process gas to the process field; and a fourth step of shutting off supply of the first process gas to the process field, wherein each of the cycles is arranged not to turn any one of the first, second, and third process gases into plasma outside the process field during supply thereof, but to heat the process field to a first temperature, at which the silane family gas, the nitriding gas, and the carbon hydride gas react with each other, during the first, second, third, and fourth steps.

According to a second aspect of the present invention, there is provided an apparatus for forming an SiCN film on a target substrate, the apparatus comprising: a process container having a process field configured to accommodate the target substrate; a support member configured to support the target substrate inside the process field; a heater configured to heat the target substrate inside the process field; an exhaust system configured to exhaust gas from the process field; a first process gas supply circuit configured to supply a first process gas containing a silane family gas to the process field; a second process gas supply circuit configured to supply a second process gas containing a nitriding gas to the process field; a third process gas supply circuit configured to supply a third process gas containing a carbon hydride gas to the process field; and a control section configured to control an operation of the apparatus, wherein the control section is preset to conduct a method for forming an SiCN film on the target substrate in the process field by performing a plurality of cycles to laminate thin films respectively formed by the cycles, thereby forming the SiCN film with a predetermined thickness, each of the cycles comprising a first step of performing supply of the first process gas to the process field, a second step of performing supply of the second process gas to the process field, a third step of performing supply of the third process gas to the process field, and a fourth step of shutting off supply of the first process gas to the process field, wherein each of the cycles is arranged not to turn any one of the first, second, and third process gases into plasma outside the process field during supply thereof, but to heat the process field to a first temperature, at which the silane family gas, the nitriding gas, and the carbon hydride gas react with each other, during the first, second, third, and fourth steps.

According to a third aspect of the present invention, there is provided a computer readable medium containing program instructions for execution on a processor, which is used for a film formation apparatus having a process field configured to be selectively supplied with a first process gas containing a silane family gas, a second process gas containing a nitriding gas, and a third process gas containing a carbon hydride gas, wherein the program instructions, when executed by the processor, cause the film formation apparatus to conduct a method for forming an SiCN film on the target substrate in the process field by performing a plurality of cycles to laminate thin films respectively formed by the cycles, thereby forming the SiCN film with a predetermined thickness, each of the cycles comprising a first step of performing supply of the first process gas to the process field, a second step of performing supply of the second process gas to the process field, a third step of performing supply of the third process gas to the process field, and a fourth step of shutting off supply of the first process gas to the process field, wherein each of the cycles is arranged not to turn any one of the first, second, and third process gases into plasma outside the process field during supply thereof, but to heat the process field to a first temperature, at which the silane family gas, the nitriding gas, and the carbon hydride gas react with each other, during the first, second, third, and fourth steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 11A, 11B, and 11C are timing charts showing the gas supply of film formation methods according to an eighth embodiment of the present invention and modifications thereof;

DETAILED DESCRIPTION OF THE INVENTION

Figure 1:
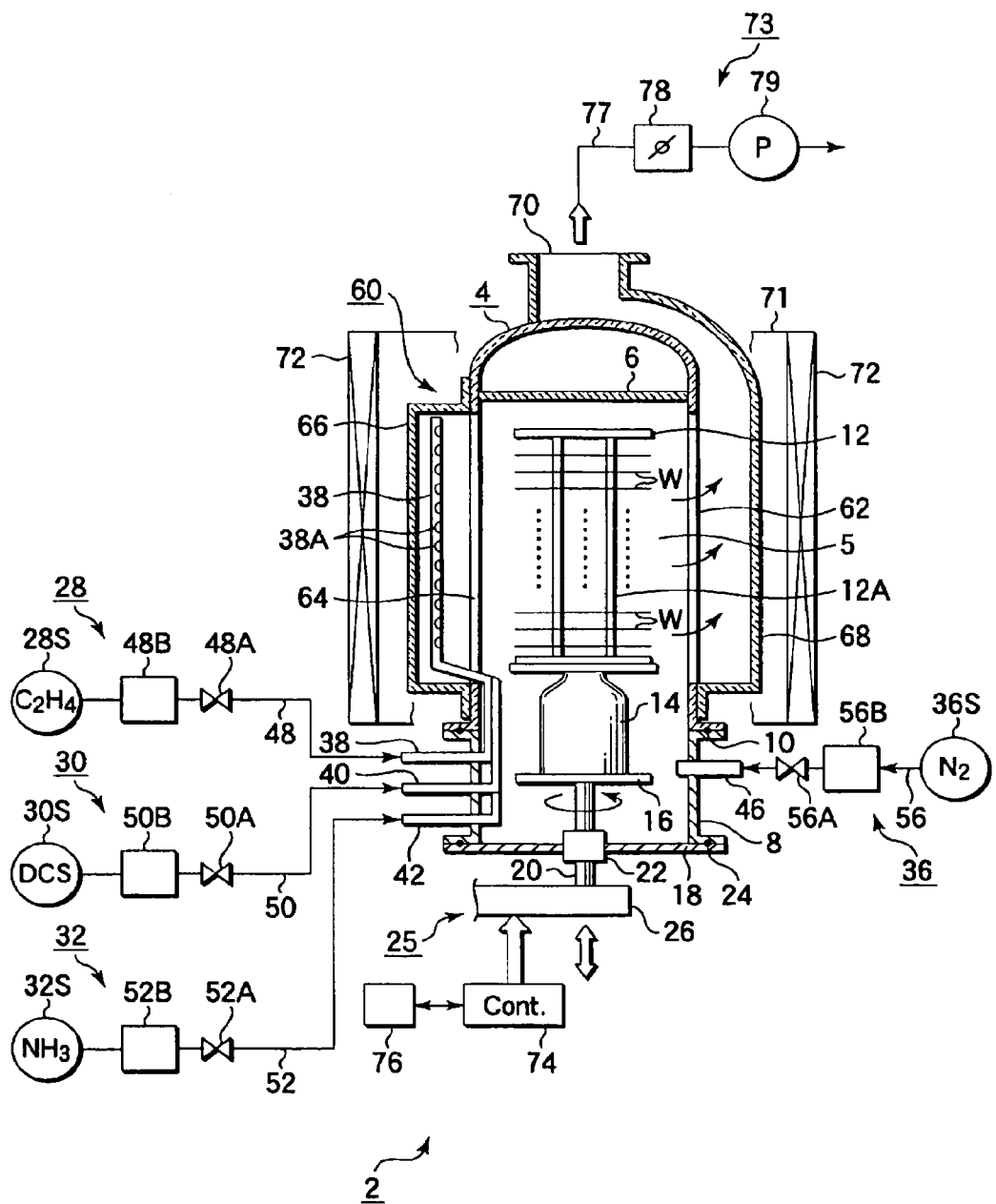
FIG. 1 is a sectional view showing a vertical film formation apparatus according to an embodiment of the present invention.

In the process of developing the present invention, the inventors studied problems of conventional techniques for semiconductor processes, in relation to a method for forming a silicon nitride film. As a result, the inventors have arrived at the findings given below.

The research group including the present inventors has developed a film formation method that combines process gas supply of the ALD or MLD type with process gas activation by plasma (US 2006/205231 A1 and so forth) in light of the problems explained in "Description of the Related Art". According to this method, $NH_3$ and so forth are activated by use of plasma to promote nitridation process to attain a high throughput, while a certain amount of carbon is introduced into an SiCN film to improve the chemical resistance thereof to some extent. In this case, as compared to the conventional technique, even where an SiCN film is formed at a lower temperature, the film can be provided with properties showing a lower etching rate and suitable for an inter-level insulating film.

However, according to later researches, it has been found that the film formation method using plasma described above is preferable in throughput, but has difficulty in increasing the carbon content (added amount) of the insulating film, resulting in a tight limit on the improvement in chemical resistance.

In recent years, owing to the demands for decreases in the line width and film thickness of semiconductor devices, requirements concerning the processability of insulating films have been becoming stricter. Accordingly, the film formation method described above may be unable to satisfy the requirements.

Embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
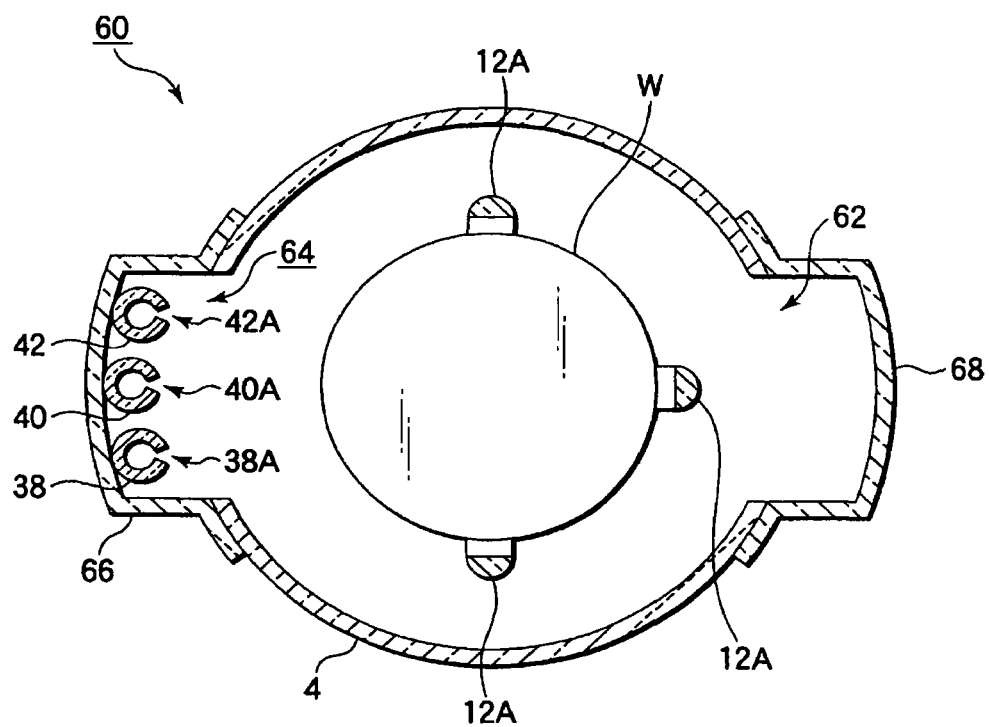
FIG. 2 is a sectional plan view showing part of the apparatus shown in FIG. 1.

FIG. 1 is a sectional view showing a vertical film formation apparatus according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, and a third process gas containing $C_2H_4$ gas (ethylene gas) as a carbon hydride gas. The film formation apparatus 2 is configured to form an SiCN film, which is a silicon nitride film containing carbon, on target substrates in the process field.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down in unison. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a third process gas supply circuit 28, a first process gas supply circuit 30, a second process gas supply circuit 32, and a purge gas supply circuit 36. The first process gas supply circuit 30 is arranged to supply a first process gas containing a silane family gas, such as DCS (dichlorosilane) gas. The second process gas supply circuit 32 is arranged to supply a second process gas containing a nitriding gas, such as ammonia ($NH_3$) gas. The third process gas supply circuit 28 is arranged to supply a third process gas containing a carbon hydride gas, such as $C_2H_4$ gas (ethylene gas). The purge gas supply circuit 36 is arranged to supply an inactive gas, such as $N_2$ gas, as a purge gas. Each of the first to third process gases is mixed with a suitable amount of carrier gas (such as $N_2$ gas), as needed. However, such a carrier gas will not be mentioned, hereinafter, for the sake of simplicity of explanation.

More specifically, the third, first, and second process gas supply circuits 28, 30, and 32 include gas distribution nozzles 38, 40, and 42, respectively, each of which is formed of a quartz pipe which penetrates the sidewall of the manifold 8 from the outside and then turns and extends upward (see FIG. 1). The gas distribution nozzles 38, 40, and 42 respectively have a plurality of gas spouting holes 38A, 40A, and 42A, each set of holes being formed at predetermined intervals in the longitudinal direction (the vertical direction) over all the wafers W on the wafer boat 12. Each of the gas spouting holes 38A, 40A, and 42A delivers the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 38, 40, 42, and 46 are connected to gas sources 28S, 30S, 32S, and 36S of $C_2H_4$ gas, DCS gas, $NH_3$ gas, and $N_2$ gas, respectively, through gas supply lines (gas passages) 48, 50, 52, and 56, respectively. The gas supply lines 48, 50, 52, and 56 are provided with switching valves 48A, 50A, 52A, and 56A and flow rate controllers 48B, 50B, 52B, and 56B, such as mass flow controllers, respectively. With this arrangement, $C_2H_4$ gas, DCS gas, $NH_3$ gas, and $N_2$ gas can be supplied at controlled flow rates. The gas supply lines (gas passages) 48, 50, and 52 are further connected to a gas source of $N_2$ gas (not shown).

A nozzle reception recess 60 is formed at the sidewall of the process container 4 to extend in the vertical direction. The nozzle reception recess 60 has a vertically long and thin opening 64 formed by cutting a predetermined width of the sidewall of the process container 4 in the vertical direction. The opening 64 is covered with a quartz cover 66 airtightly connected to the outer surface of the process container 4. The cover 66 has a vertically long and thin shape with a concave cross-section, so that it projects outward from the process container 4.

Accordingly, the nozzle reception recess 60 is formed such that it projects outward from the sidewall of the process container 4 and is connected on the other side to the interior of the process container 4. In other words, the inner space of the nozzle reception recess 60 communicates through the opening 64 with the process field 5 within the process container 4. The opening 64 has a vertical length sufficient to cover all the wafers W on the wafer boat 12 in the vertical direction.

The gas distribution nozzles 38, 40 and 42 are bent outward in the radial direction of the process container 4 at a position lower than the lowermost wafer W on the wafer boat 12. Then, the gas distribution nozzles 38, 40 and 42 vertically extend side by side at the deepest position (the farthest position from the center of the process container 4) in the nozzle reception recess 60. The gas spouting holes 38A, 40A, and 42A of the gas distribution nozzles 38, 40 and 42 are formed at positions between the wafers W on the wafer boat 12 to respectively deliver the corresponding gases essentially uniformly in the horizontal direction, so as to form gas flows parallel with the wafers W. The gases are spouted inward from the gas spouting holes 38A, 40A, and 42A of the gas distribution nozzles 38, 40 and 42, and are supplied through the opening 64 onto the wafers W on the wafer boat 12. When the inactive gas comprising $N_2$ gas is spouted from the gas distribution nozzles 38, 40 and 42, this gas is supplied in the same manner to form gas flows parallel with the wafers W.

On the other hand, on the side of the process container 4 opposite to the nozzle reception recess 60, a long and thin exhaust port 62 for vacuum-exhausting the inner atmosphere is formed by cutting the sidewall of the process container 4. As shown in FIG. 1, the exhaust port 62 has a vertical length sufficient to cover all the wafers W on the wafer boat 12 in the vertical direction. The exhaust port 62 is covered with an exhaust port cover member 68 made of quartz with a U-shape cross-section, and attached by welding. The exhaust port cover member 68 extends upward along the sidewall of the process container 4, and has a gas outlet 70 at the top of the process container 4. The gas outlet 70 is connected to a vacuum-exhaust system 73 including a vacuum pump and so forth. The vacuum exhaust system 73 has an exhaust passage 77 connected to the gas outlet 70, on which a valve unit (an opening degree adjustment valve) 78, a vacuum pump 79, and so forth are disposed in this order from the upstream side.

The process container 4 is surrounded by a casing 71. The casing 71 is provided with a heater 72 on the inner surface for heating the atmosphere and wafers W inside the process container 4. For example, the heater 72 is formed of a carbon wire, which causes no contamination and has good characteristics for increasing and decreasing the temperature. A thermocouple (not shown) is disposed near the exhaust port 62 in the process container 4 to control the heater 72.

The operation of the film formation apparatus 2 structured as described above is controlled as a whole by a control section 74, such as a computer. Computer programs for executing operations of the apparatus 2 are stored in a storage section 76 comprising a storage medium, such as a flexible disk, CD (Compact Disc), hard disk, and/or flash memory. In accordance with instructions from the control section 74, the start/stop of supply of the respective gases, the gas flow rates thereof, the process temperature, and the process pressure are controlled.

Next, an explanation will be given of a film formation method (so called ALD or MLD film formation) performed in the apparatus shown in FIG. 1. In this film formation method, an insulating film of SiCN (silicon carbon nitride) is formed on semiconductor wafers by ALD or MLD. In order to achieve this, a first process gas containing dichlorosilane (DCS) gas as a silane family gas, a second process gas containing ammonia ($NH_3$) gas as a nitriding gas, and a third process gas containing $C_2H_4$ gas (ethylene gas) as a carbon hydride gas are selectively supplied into the process field 5 accommodating wafers W. Specifically, a film formation process is performed along with the following operations.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to third process gases are intermittently or continuously supplied from the respective gas distribution nozzles 40, 42, and 38 at controlled flow rates.

The first process gas containing DCS gas, the second process gas containing $NH_3$ gas, and the third process gas containing $C_2H_4$ gas are supplied from the gas spouting holes 40A, 42A, and 38A of the gas distribution nozzles 40, 42, and 38, respectively, to form gas flows parallel with the wafers W on the wafer boat 12. While being supplied, molecules of DCS gas, $NH_3$ gas, and $C_2H_4$ gas and molecules and atoms of decomposition products generated by their decomposition are adsorbed on the wafers W. These gas molecules and/or decomposition components react with each other on the wafers W by use of heat of the heater 72, thereby forming a unit thin film of SiCN on the wafers W. Such a cycle for forming a unit thin film is repeated a number of times, and thin films of SiCN formed by respective times are laminated, thereby arriving at an SiCN film having a target thickness.

For example, where each cycle is arranged to supply the first and third process gases prior to the second process gas, DCS and $C_2H_4$ first react with each other on the wafer surface and form a thin SiC film adsorbed on the wafers W. Then, when the second process gas is supplied, $NH_3$ reacts with the SiC film adsorbed on the wafers W and forms a unit thin film of SiCN. Alternatively, for example, where each cycle is arranged to supply the first and second process gases prior to the third process gas, DCS and $NH_3$ first react with each other on the wafer surface and form a thin SiN film adsorbed on the wafers W. Then, when the third process gas is supplied, $C_2H_4$ reacts with the SiN film adsorbed on the wafers W and forms a unit thin film of SiCN.

Next, an explanation will be given of the gas supply timing according to embodiments of the present invention. In all the drawings showing timing charts, the first process gas is denoted by DCS, the second process gas is denoted by $NH_3$, and the third process gas is denoted by $C_2H_4$, as shown in, e.g., FIG. 3A, for the sake of convenience in understanding. Further, in these drawings, reference symbols 80 and 82 respectively denote steps of performing and shutting off supply of the first process gas. The reference symbols 84 and 86 respectively denote steps of performing and shutting off supply of the second process gas. The reference symbols 88 and 90 respectively denote steps of performing and shutting off supply of the third process gas.

First Embodiment

Figure 3A:
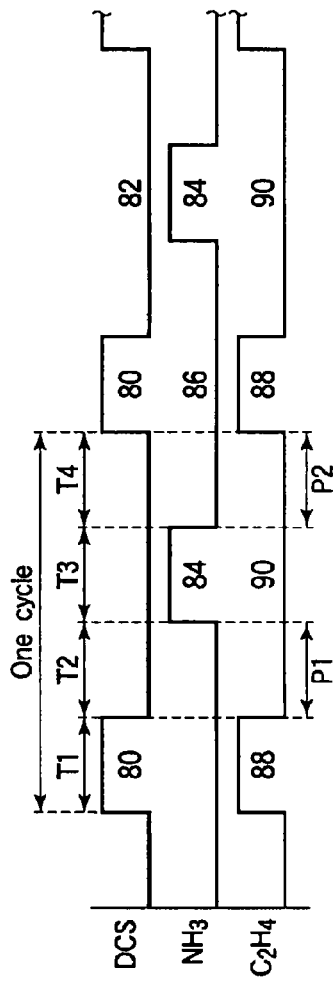
FIGS. 3A, 3B, and 3C are timing charts showing the gas supply of film formation methods according to a first embodiment of the present invention and modifications thereof.

FIG. 3A is a timing chart showing the gas supply of a film formation method according to a first embodiment of the present invention. As shown in FIG. 3A, the film formation method according to this embodiment is arranged to alternately repeat first to fourth periods T1 to T4. A cycle comprising the first to fourth periods T1 to T4 is repeated a number of times, and thin films of SiCN formed by respective times are laminated, thereby arriving at an SiCN film having a target thickness.

Specifically, the first period T1 is arranged to perform supply of the first and third process gases to the process field 5, while shutting off supply of the second process gas to the process field 5. The second period T2 is arranged to shut off supply of the first, second, and third process gases to the process field 5. The third period T3 is arranged to perform supply of the second process gas to the process field 5, while shutting off supply of the first and third process gases to the process field 5. The fourth period T4 is arranged to shut off supply of the first, second, and third process gases to the process field 5.

In this embodiment, the first process gas supply step 80, second process gas supply step 84, and third process gas supply step 88 are set to have lengths the same as or close to each other. The first and third process gas supply steps 80 and 88 are performed synchronously (to completely overlap with each other), and thus the first and third process gas shutoff steps 82 and 90 are performed synchronously (to completely overlap with each other). The second process gas supply step 84 is performed essentially in the middle of the first and third process gas shutoff steps 82 and 90. The first and third process gas supply steps 80 and 88 are performed essentially in the middle of the second process gas shutoff step 86.

The second and fourth periods T2 and T4 are respectively used as purge steps P1 and P2 to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while shutting off supply of all the gases. In this respect, the second and fourth periods T2 and T4 may be arranged such that the first half utilizes only vacuum-exhaust and the second half utilizes both vacuum-exhaust and inactive gas supply. Further, the first and third periods T1 and T3 may be arranged to stop vacuum-exhausting the process container 4 while supplying each of the first to third process gases. However, where supplying each of the first to third process gases is performed along with vacuum-exhausting the process container 4, the interior of the process container 4 can be continuously vacuum-exhausted over the entirety of the first to fourth periods T1 to T4.

For example, in FIG. 3, the first period T1 is set at about 4 seconds, the second period T2 is set at about 5 seconds, the third period T3 is set at about 6 seconds, and the fourth period T4 is set at about 5 seconds. In general, the film thickness obtained by one cycle of the first to fourth periods T1 to T4 is about 0.048 to 0.13 nm. Accordingly, for example, where the target film thickness is 70 nm, the cycle is repeated about 600 times. However, these values of time and thickness are merely examples and thus are not limiting.

As described above, the period T1 of supplying the first and third process gases simultaneously without turning these gases into plasma (i.e., without turning them into radicals) outside the process field 5, and the period T3 of solely supplying the second process gas without turning this gas into plasma (i.e., without turning it into radicals) outside the process field 5 are alternately performed with the periods T2 and T4 of shutting off supply of the process gases (purge steps P1 and P2) respectively interposed therebetween. In this case, although the film formation temperature is set to be lower than the conventional film formation temperature of, e.g., about 760° C., it is possible to introduce a larger amount of carbon into the formed SiCN film, so as to decrease the etching rate of the film relative to dilute hydrofluoric acid used in a cleaning process or etching process performed on the surface of the film. Consequently, the film is not excessively etched by cleaning, and thus the cleaning process is performed with high controllability in the film thickness. Further, the film can sufficiently serve as an etching stopper film or inter-level insulating film.

Furthermore, as described above, the periods T2 and T4 of shutting off supply of the process gases between the periods T1 and T2 of performing supply of the process gases serve not only as the purge steps P1 and P2 but also as periods for reforming the film quality. The surface of an SiCN film, formed immediately before each of these periods, is reformed in this period, thereby improving the film quality. Consequently, the etching rate of the SiCN film is further decreased. The effect of the reformation process at an atomic level is thought to be as follows. Specifically, when an SiCN film containing carbon atoms is formed, some of the Cl atoms derived from DCS gas are not desorbed but bonded in an activated state to the uppermost surface of this thin film. During the periods T2 and T4 of shutting off supply of DCS gas, C atoms or N atoms derived from $C_2H_4$ or and $NH_3$ gas replace Cl atoms on the uppermost surface of the thin film, and reduce Cl components in the film, thereby decreasing the etching rate. Particularly, where $C_2H_4$ gas is used, the number of C atoms taken into the film is increased, thereby further decreasing the etching rate.

The process conditions of the film formation process are as follows. The flow rate of DCS gas is set to be within a range of 500 to 5,000 sccm, e.g., at 1,000 sccm (1 slm). The flow rate of $NH_3$ gas is set to be within a range of 100 to 10,000 sccm, e.g., at 1,000 sccm. The flow rate of $C_2H_4$ gas is set to be within a range of 100 to 5,000 sccm, e.g., at 500 sccm. The flow rate of $C_2H_4$ gas is set to be not more than three times the flow rate of DCS gas. This is so because, if the flow rate of $C_2H_4$ gas used as a carbon hydride gas is excessively high, the film quality is undesirably drastically lowered.

The process temperature is lower than ordinary CVD processes, and is set to be within a range of 300 to 700° C., and preferably a range of 550 to 650° C., such as 630° C. If the process temperature is lower than 300° C., essentially no film is deposited because hardly any reaction is caused. If the process temperature is higher than 700° C., a low quality CVD film is deposited, and existing films, such as a metal film, suffer thermal damage.

The process pressure is set to be within a range of 13 Pa (0.1 Torr) to 1,330 Pa (10 Torr), and preferably a range of 40 Pa (0.3 Torr) to 266 Pa (2 Torr). For example, the process pressure is set at 1 Torr during the first period (adsorption step) T1, and at 10 Torr during the third period (nitridation step) T3. If the process pressure is lower than 13 Pa, the film formation rate becomes lower than the practical level. On the other hand, if the process pressure exceeds 1,330 Pa, the reaction mode is shifted from an adsorption reaction to a vapor-phase reaction, which then becomes prevailing on the wafers W. This is undesirable, because the inter-substrate uniformity and planar uniformity of the film are deteriorated, and the number of particles due to the vapor-phase reaction suddenly increases.

Figure 3B:
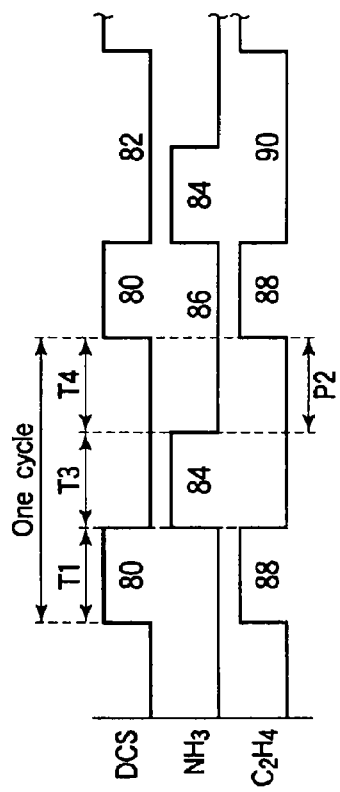

The timing chart shown in FIG. 3A includes two purge steps P1 and P2, but they may be partly or wholly omitted. FIG. 3B shows a timing chart of a modification 1 of the first embodiment, in which the first purge step P1 in FIG. 3A is omitted. In this case, one cycle is formed of the periods T1, T3, and T4. Specifically, the first and third process gas supply steps 80 and 88 are directly followed by the second process gas supply step 84 with no purge step interposed therebetween, and then the purge step P2 is performed.

Figure 3C:
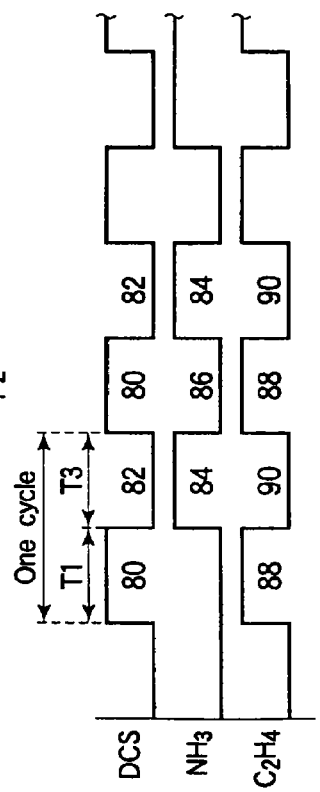

FIG. 3C shows a timing chart of a modification 2 of the first embodiment, in which the two purge steps P1 and P2 in FIG. 3A are omitted. In this case, one cycle is formed of the periods T1 and T3. Specifically, one cycle is completed such that the first and third process gas supply steps 80 and 88 are directly followed by the second process gas supply step 84 with no purge step interposed therebetween. Further, although not shown in the drawings, the modification 3 of the first embodiment is arranged such that only the last purge step P2 in FIG. 3A is omitted. According to a film formation method, in which the purge steps are partly or wholly omitted, the processing rate is increased by that much, thereby improving the throughput.

In order to control the carbon content of an SiCN film thus formed, the length of the third process gas supply step 88, i.e., $C_2H_4$ adsorption time, and/or the length of the second process gas supply step 84, i.e., nitridation time, may be adjusted.

<Examination on SiCN Film>

As present examples, a film formation method according to the first embodiment was used while the lengths of the second and/or third process gas supply steps 84 and/or 88 were adjusted to form SiCN films having different values of carbon concentration (content). As a comparative example CE1, an SiN film was formed without supplying $C_2H_4$ gas. As a comparative example CE2, an SiN film was formed by use of plasma (a film formation method according to the disclosure of US 2007/167028 A1). Each of the films thus formed was etched with dilute hydrofluoric acid DHF (200:1).

Figure 4:
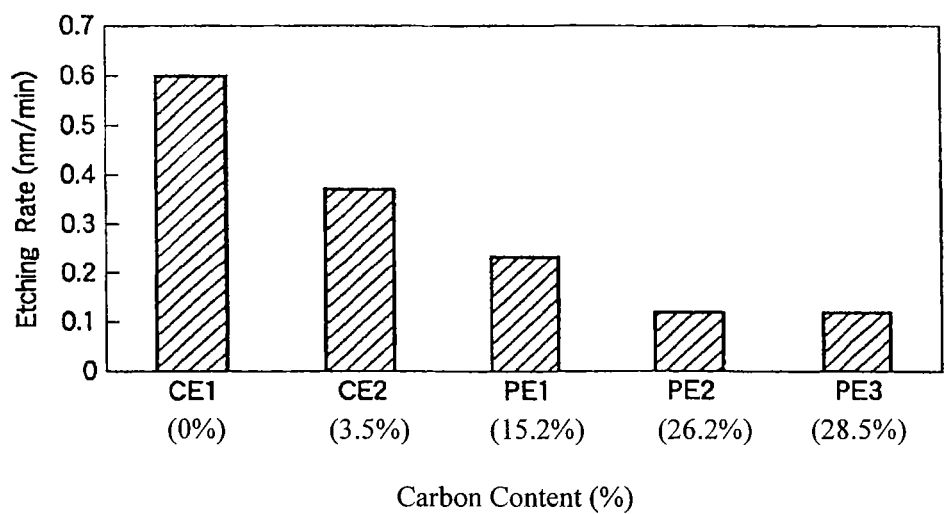
FIG. 4 is a graph showing the relationship between the carbon content of an SiCN film and etching rate, obtained by an experiment.

FIG. 4 is a graph showing the relationship between the carbon content of an SiCN film and etching rate, obtained by the experiment. As shown in FIG. 4, the comparative example CE1 (SiN film containing no carbon) rendered a very high etching rate of 0.6 nm/min. The comparative example CE2 (SiCN film formed by use of plasma) had a carbon concentration of about 3.5% at most, and rendered a considerable etching rate of 0.35 nm/min.

On the other hand, in the case of a film formation method according to the first embodiment, the carbon concentration in an SiCN film was greatly increased and controllable within a range of 15.2% to 28.5% by condition adjustment. As representatives of the SiCN films formed by a film formation method according to the first embodiment, FIG. 4 shows data concerning a first present example PE1 with a carbon concentration of 15.2%, a second present example PE2 with a carbon concentration of 26.2%, and a third present example PE3 with a carbon concentration of 28.5%. The first, second, third present examples PE1, PE2, and PE3 rendered etching rates within a range of 0.22 to 0.1 nm/ml, which were sufficiently lower than those of the comparative examples CE1 and CE2.

Second Embodiment

Figure 5A:
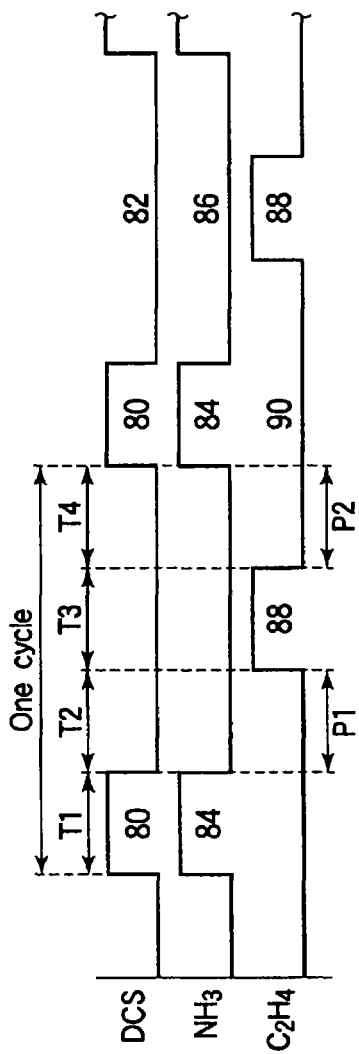
FIGS. 5A, 5B, and 5C are timing charts showing the gas supply of film formation methods according to a second embodiment of the present invention and modifications thereof.

FIG. 5A is a timing chart showing the gas supply of a film formation method according to a second embodiment of the present invention. As shown in FIG. 5A, the film formation method according to this embodiment is arranged such that supply of the first process gas (DCS supply) is performed in the same timing as the first embodiment shown in FIG. 3A, and supply of the second process gas (NH$_3$ supply) and supply of the third process gas (C$_2$H$_4$ supply) are performed in timings exchanged with each other as compared to the method shown in FIG. 3A.

Specifically, the first period T1 is arranged to perform supply of the first and second process gases to the process field 5 (first and second process gas supply steps 80 and 84), while shutting off supply of the third process gas to the process field 5. The second period T2 is arranged to shut off supply of the first, second, and third process gases to the process field 5 (purge step P1). The third period T3 is arranged to perform supply of the third process gas to the process field 5 (third process gas supply step 88), while shutting off supply of the first and second process gases to the process field 5. The fourth period T4 is arranged to shut off supply of the first, second, and third process gases to the process field 5 (purge step P2).

This embodiment can also provide the same effect as the first embodiment, i.e., although the film formation temperature is set to be lower, it is possible to introduce a larger amount of carbon into the formed SiCN film. Consequently, the etching rate of the SiCN film is decreased, and thus the cleaning process is performed with high controllability in the film thickness. Further, the SiCN film can sufficiently serve as an insulating film for a specific purpose, such as an etching stopper film or inter-level insulating film.

Figure 5B:
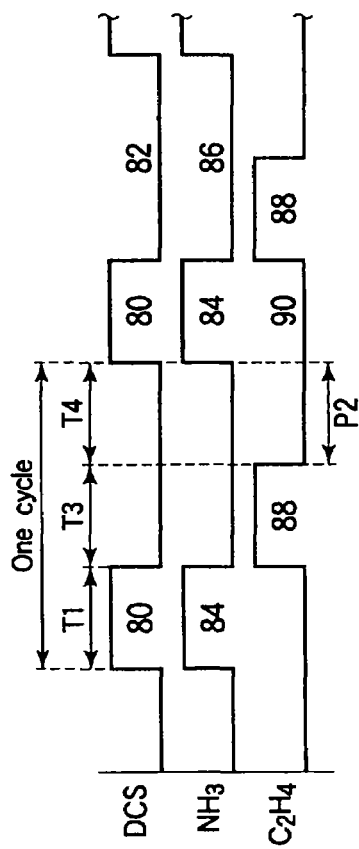

The timing chart shown in FIG. 5A includes two purge steps P1 and P2, but they may be partly or wholly omitted. FIG. 5B shows a timing chart of a modification 1 of the second embodiment, in which the first purge step P1 in FIG. 5A is omitted. In this case, one cycle is formed of the periods T1, T3, and T4. Specifically, the first and second process gas supply steps 80 and 84 are directly followed by the third process gas supply step 88 with no purge step interposed therebetween, and then the purge step P2 is performed.

Figure 5C:
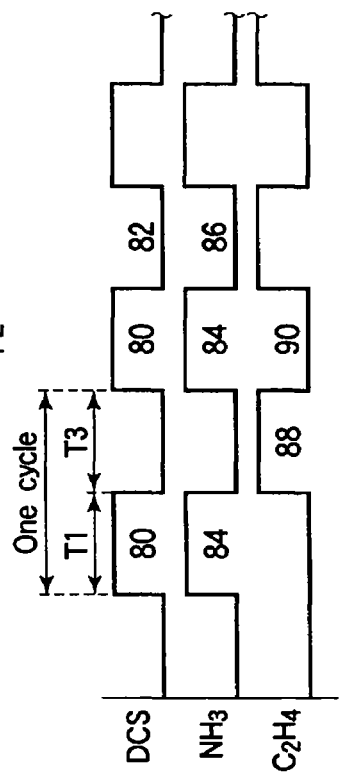

FIG. 5C shows a timing chart of a modification 2 of the second embodiment, in which the two purge steps P1 and P2 in FIG. 5A are omitted. In this case, one cycle is formed of the periods T1 and T3. Specifically, one cycle is completed such that the first and second process gas supply steps 80 and 84 are directly followed by the third process gas supply step 88 with no purge step interposed therebetween. Further, although not shown in the drawings, the modification 3 of the second embodiment is arranged such that only the last purge step P2 in FIG. 5A is omitted. According to a film formation method, in which the purge steps are partly or wholly omitted, the processing rate is increased by that much, thereby improving the throughput.

Third Embodiment

Figure 6A:
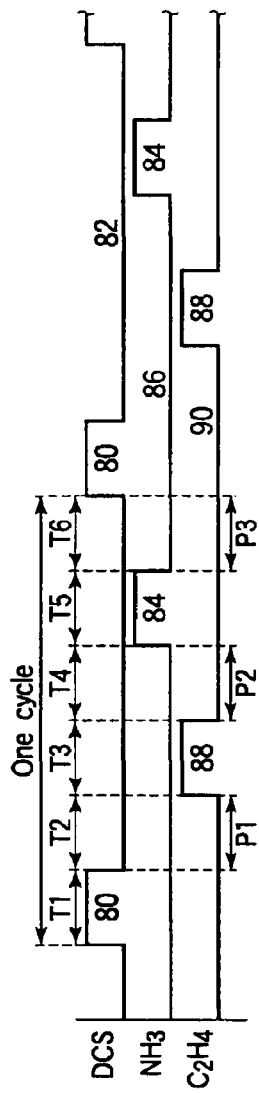
FIGS. 6A, 6B, 6C, and 6D are timing charts showing the gas supply of film formation methods according to a third embodiment of the present invention and modifications thereof.

FIG. 6A is a timing chart showing the gas supply of a film formation method according to a third embodiment of the present invention. As shown in FIG. 6A, the film formation method according to this embodiment is arranged to alternately repeat first to sixth periods T1 to T6. A cycle comprising the first to sixth periods T1 to T6 is repeated a number of times, and thin films of SiCN formed by respective times are laminated, thereby arriving at an SiCN film having a target thickness.

Specifically, the first period T1 is arranged to perform supply of the first process gas to the process field 5 (first process gas supply step 80), while shutting off supply of the second and third process gases to the process field 5. The second period T2 is arranged to shut off supply of the first, second, and third process gases to the process field 5 (purge step P1). The third period T3 is arranged to perform supply of the third process gas to the process field 5 (third process gas supply step 88), while shutting off supply of the first and second process gases to the process field 5. The fourth period T4 is arranged to shut off supply of the first, second, and third process gases to the process field 5 (purge step P2). The fifth period T5 is arranged to perform supply of the second process gas to the process field 5 (second process gas supply step 84), while shutting off supply of the first and third process gases to the process field 5. The sixth period T6 is arranged to shut off supply of the first, second, and third process gases to the process field 5 (purge step P3).

For example, the first to fourth periods T1 to T4 are set to have the same lengths as those of the first embodiment, while the fifth period T5 is set at about 6 seconds, and the sixth period T6 is set at about 5 seconds. This embodiment can also provide the same effect as the first embodiment, i.e., although the film formation temperature is set to be lower, it is possible to introduce a larger amount of carbon into the formed SiCN film.

Figure 6B:
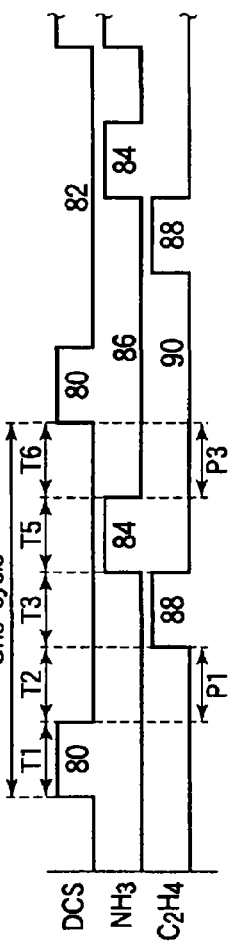

The timing chart shown in FIG. 6A includes three purge steps P1, P2, and P3, but they may be partly or wholly omitted. FIG. 6B shows a timing chart of a modification 1 of the third embodiment, in which the second purge step P2 in FIG. 6A is omitted. In this case, one cycle is formed of the periods T1, T2, T3, T5, and T6. Specifically, the third process gas supply step 88 is directly followed by the second process gas supply step 84 with no purge step interposed therebetween.

Figure 6C:
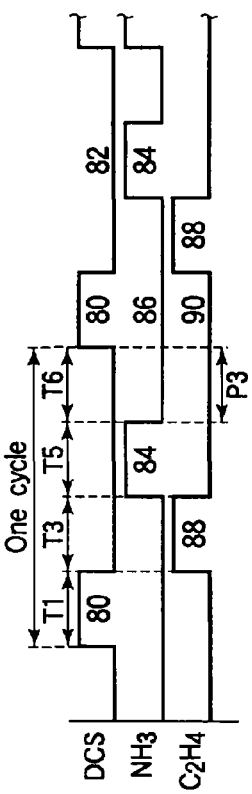

FIG. 6C shows a timing chart of a modification 2 of the third embodiment, in which the first and second purge steps P1 and P2 in FIG. 6A are omitted. In this case, one cycle is formed of the periods T1, T3, T5, and T6.

Figure 6D:
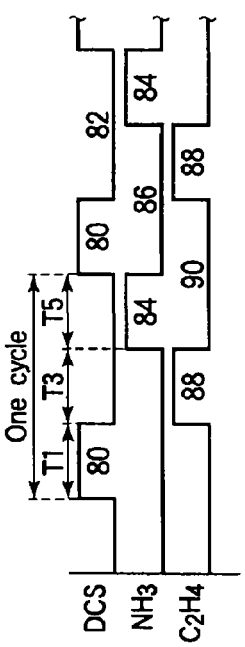

FIG. 6D shows a timing chart of a modification 3 of the third embodiment, in which the first to third purge steps P1 to P3 in FIG. 6A are omitted. In this case, one cycle is formed of the periods T1, T3, and T5.

Fourth Embodiment

Figure 7A:
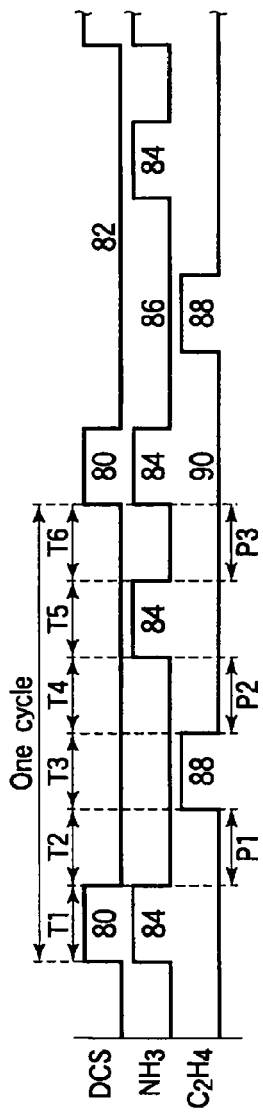
FIGS. 7A, 7B, 7C, and 7D are timing charts showing the gas supply of film formation methods according to a fourth embodiment of the present invention and modifications thereof.

FIG. 7A is a timing chart showing the gas supply of a film formation method according to a fourth embodiment of the present invention. As shown in FIG. 7A, the film formation method according to this embodiment is arranged to be the same as that of the third embodiment shown in FIG. 6A except that supply of the second process gas (NH$_3$ supply) is performed not only in the fifth period T5 but also in the first period T1. In other words, the second process gas supply step 84 is performed twice (a plurality of times) in one cycle. The number of this plurality of times may be further increased.

This embodiment can also provide the same effect as the first embodiment, i.e., although the film formation temperature is set to be lower, it is possible to introduce a larger amount of carbon into the formed SiCN film.

Figure 7B:
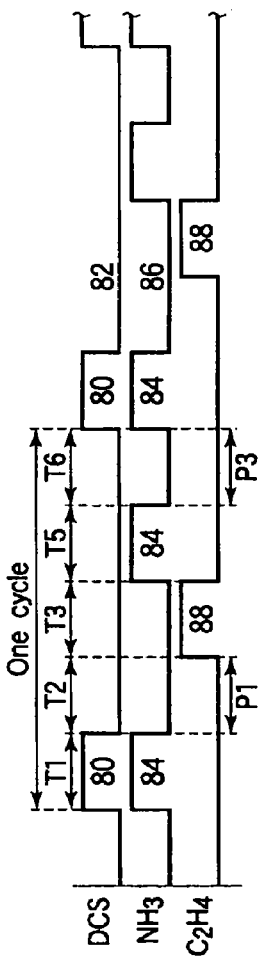

The timing chart shown in FIG. 7A includes three purge steps P1, P2, and P3, but they may be partly or wholly omitted. FIG. 7B shows a timing chart of a modification 1 of the fourth embodiment, in which the second purge step P2 in FIG. 7A is omitted. In this case, one cycle is formed of the periods T1, T2, T3, T5, and T6. Specifically, the third process gas supply step 88 is directly followed by the second process gas supply step 84 with no purge step interposed therebetween.

Figure 7C:
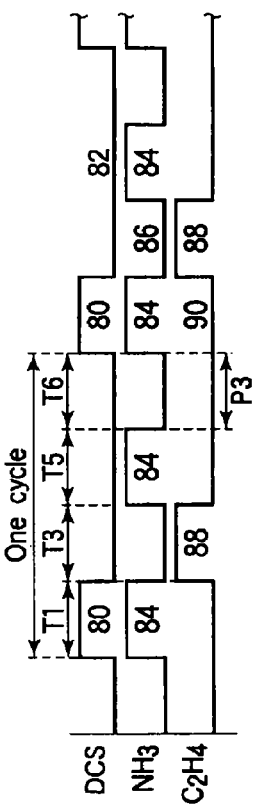

FIG. 7C shows a timing chart of a modification 2 of the fourth embodiment, in which the first and second purge steps P1 and P2 in FIG. 7A are omitted. In this case, one cycle is formed of the periods T1, T3, T5, and T6.

Figure 7D:
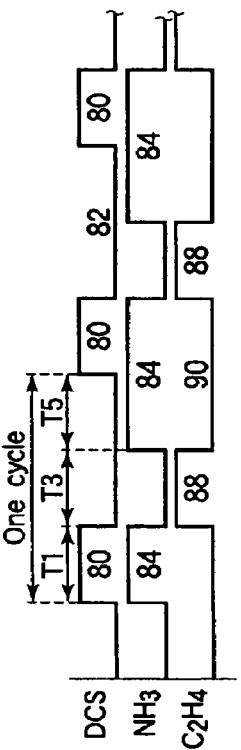

FIG. 7D shows a timing chart of a modification 3 of the fourth embodiment, in which the first to third purge steps P1 to P3 in FIG. 7A are omitted. In this case, one cycle is formed of the periods T1, T3, and T5.

Fifth Embodiment

Figure 8A:
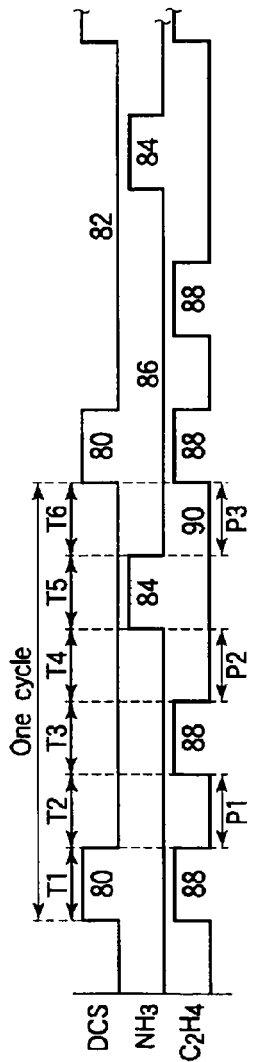
FIGS. 8A, 8B, 8C, and 8D are timing charts showing the gas supply of film formation methods according to a fifth embodiment of the present invention and modifications thereof.

FIG. 8A is a timing chart showing the gas supply of a film formation method according to a fifth embodiment of the present invention. As shown in FIG. 8A, the film formation method according to this embodiment is arranged to be the same as that of the third embodiment shown in FIG. 6A except that supply of the third process gas ($C_2H_4$ supply) is performed not only in the third period T3 but also in the first period T1. In other words, the third process gas supply step 88 is performed twice (a plurality of times) in one cycle. The number of this plurality of times may be further increased.

This embodiment can also provide the same effect as the first embodiment, i.e., although the film formation temperature is set to be lower, it is possible to introduce a larger amount of carbon into the formed SiCN film.

Figure 8B:
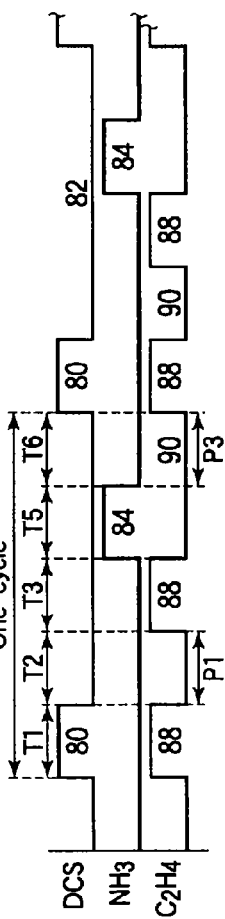

The timing chart shown in FIG. 8A includes three purge steps P1, P2, and P3, but they may be partly or wholly omitted. FIG. 8B shows a timing chart of a modification 1 of the fifth embodiment, in which the second purge step P2 in FIG. 8A is omitted. In this case, one cycle is formed of the periods T1, T2, T3, T5, and T6. Specifically, the third process gas supply step 88 is directly followed by the second process gas supply step 84 with no purge step interposed therebetween.

Figure 8C:
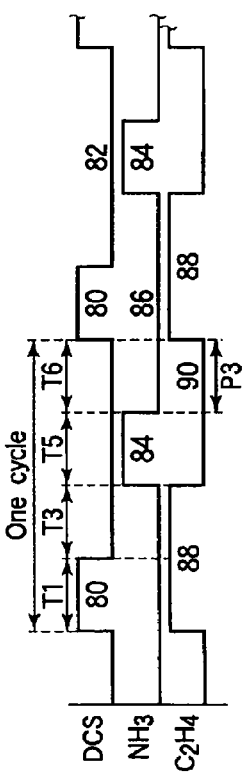

FIG. 8C shows a timing chart of a modification 2 of the fifth embodiment, in which the first and second purge steps P1 and P2 in FIG. 8A are omitted. In this case, one cycle is formed of the periods T1, T3, T5, and T6. The two periods of the third process gas supply step 88 are continuous, and thus become totally longer than the first process gas supply step 80.

Figure 8D:
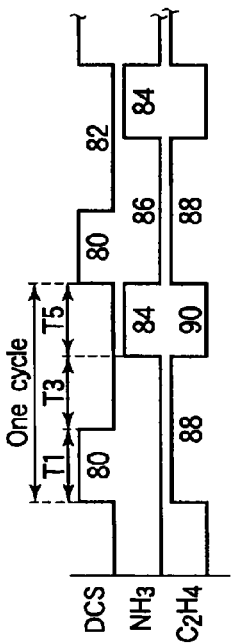

FIG. 8D shows a timing chart of a modification 3 of the fifth embodiment, in which the first to third purge steps P1 to P3 in FIG. 8A are omitted. In this case, one cycle is formed of the periods T1, T3, and T5.

Sixth Embodiment

Figure 9A:
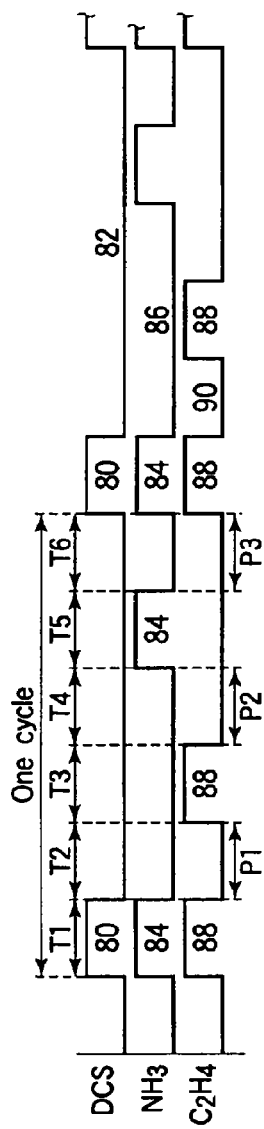
FIGS. 9A, 9B, 9C, and 9D are timing charts showing the gas supply of film formation methods according to a sixth embodiment of the present invention and modifications thereof.

FIG. 9A is a timing chart showing the gas supply of a film formation method according to a sixth embodiment of the present invention. As shown in FIG. 9A, the film formation method according to this embodiment is arranged to be the same as that of the third embodiment shown in FIG. 6A except that supply of the second process gas ($NH_3$ supply) is performed not only in the fifth period T5 but also in the first period T1, and supply of the third process gas ($C_2H_4$ supply) is performed not only in the third period T3 but also in the first period T1. In other words, each of the second process gas supply step 84 and third process gas supply step 88 is performed twice (a plurality of times) in one cycle. The number of this plurality of times may be further increased.

This embodiment can also provide the same effect as the first embodiment, i.e., although the film formation temperature is set to be lower, it is possible to introduce a larger amount of carbon into the formed SiCN film.

Figure 9B:
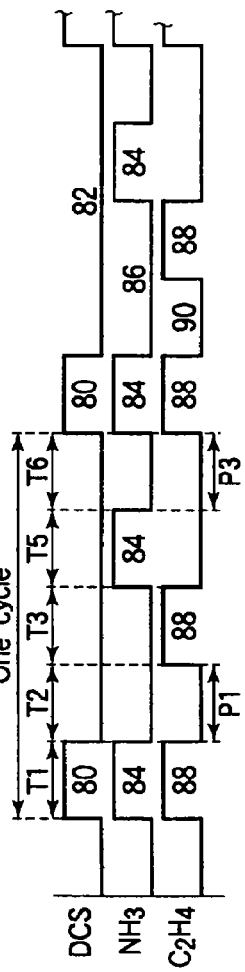

The timing chart shown in FIG. 9A includes three purge steps P1, P2, and P3, but they may be partly or wholly omitted. FIG. 9B shows a timing chart of a modification 1 of the sixth embodiment, in which the second purge step P2 in FIG. 9A is omitted. In this case, one cycle is formed of the periods T1, T2, T3, T5, and T6. Specifically, the third process gas supply step 88 is directly followed by the second process gas supply step 84 with no purge step interposed therebetween.

Figure 9C:
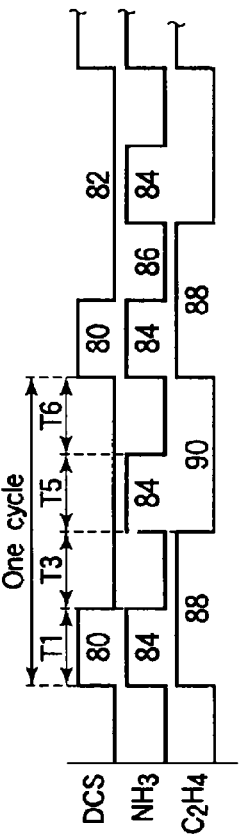

FIG. 9C shows a timing chart of a modification 2 of the sixth embodiment, in which the first and second purge steps P1 and P2 in FIG. 9A are omitted. In this case, one cycle is formed of the periods T1, T3, T5, and T6.

Figure 9D:
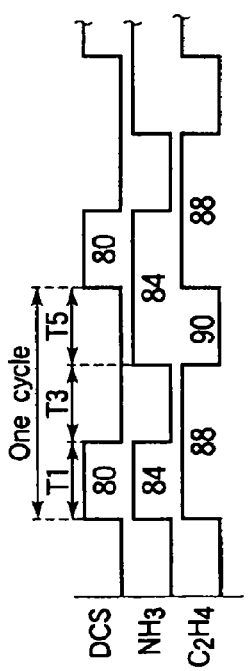

FIG. 9D shows a timing chart of a modification 3 of the sixth embodiment, in which the first to third purge steps P1 to P3 in FIG. 9A are omitted. In this case, one cycle is formed of the periods T1, T3, and T5.

Seventh Embodiment

Figure 10A:
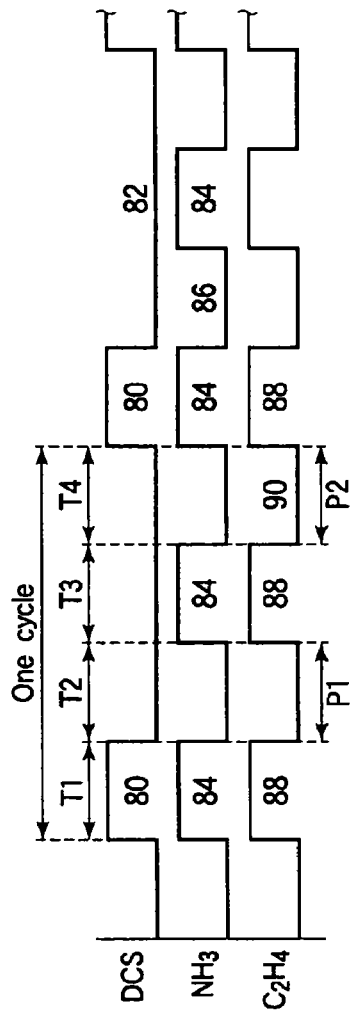
FIGS. 10A, 10B, and 10C are timing charts showing the gas supply of film formation methods according to a seventh embodiment of the present invention and modifications thereof.

FIG. 10A is a timing chart showing the gas supply of a film formation method according to a seventh embodiment of the present invention. As shown in FIG. 10A, the film formation method according to this embodiment is arranged to be the same as that of the first embodiment shown in FIG. 3A except that supply of the second process gas ($NH_3$ supply) is performed not only in the third period T3 but also in the first period T1, and supply of the third process gas ($C_2H_4$ supply) is performed not only in the first period T1 but also in the third period T3. In other words, each of the second process gas supply step 84 and third process gas supply step 88 is performed twice (a plurality of times) in one cycle. The number of this plurality of times may be further increased.

This embodiment can also provide the same effect as the first embodiment, i.e., although the film formation temperature is set to be lower, it is possible to introduce a larger amount of carbon into the formed SiCN film.

Figure 10B:
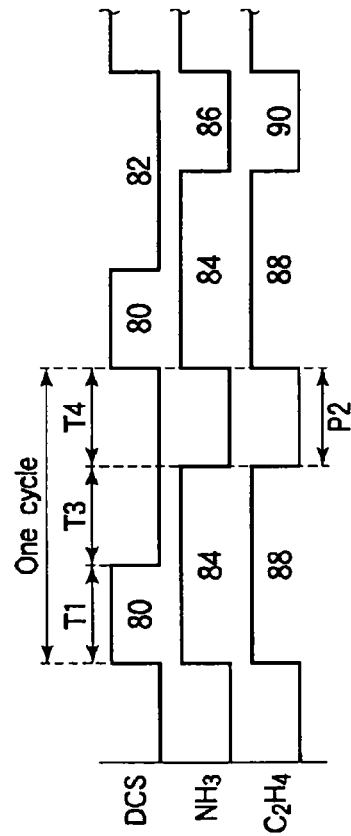

The timing chart shown in FIG. 10A includes two purge steps P1 and P2, but they may be partly or wholly omitted. FIG. 10B shows a timing chart of a modification 1 of the seventh embodiment, in which the first purge step P1 in FIG. 10A is omitted. In this case, one cycle is formed of the periods T1, T3, and T4. Specifically, the first, second, and third process gas supply steps 80, 84, and 88 performed together are directly followed by the second and third process gas supply steps 84 and 88 performed together, with no purge step interposed therebetween, and then the purge step P2 is performed.

Figure 10C:
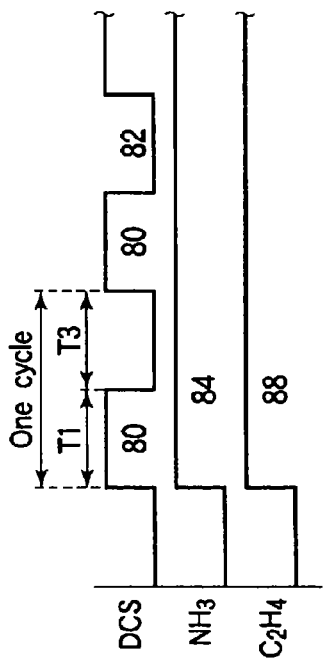

FIG. 10C shows a timing chart of a modification 2 of the seventh embodiment, in which the two purge steps P1 and P2 in FIG. 10A are omitted. In this case, one cycle is formed of the periods T1 and T3. Specifically, this embodiment is arranged to alternately perform and shut off supply of the first process gas (DCS), while continuously performing supply of the second process gas ($NH_3$) and third process gas ($C_2H_4$). Further, although not shown in the drawings, the modification 3 of the seventh embodiment is arranged such that only the last purge step P2 in FIG. 10A is omitted.

Eighth Embodiment

FIG. 11A is a timing chart showing the gas supply of a film formation method according to an eighth embodiment of the present invention. As shown in FIG. 11A, the film formation method according to this embodiment is arranged to be the same as that of the second embodiment shown in FIG. 5A except that supply of the second process gas ($NH_3$ supply) is performed not only in the first period T1 but also in the third period T3. In other words, the second process gas supply step 84 is performed twice (a plurality of times) in one cycle. The number of this plurality of times may be further increased.

This embodiment can also provide the same effect as the first embodiment, i.e., although the film formation temperature is set to be lower, it is possible to introduce a larger amount of carbon into the formed SiCN film.

The timing chart shown in FIG. 11A includes two purge steps P1 and P2, but they may be partly or wholly omitted. FIG. 11B shows a timing chart of a modification 1 of the eighth embodiment, in which the first purge step P1 in FIG. 11A is omitted. In this case, one cycle is formed of the periods T1, T3, and T4. Specifically, the first and second process gas supply steps 80 and 84 performed together are directly followed by the second and third process gas supply steps 84 and 88 performed together, with no purge step interposed therebetween, and then the purge step P2 is performed.

FIG. 11C shows a timing chart of a modification 2 of the eighth embodiment, in which the two purge steps P1 and P2 in FIG. 11A are omitted. In this case, one cycle is formed of the periods T1 and T3. Specifically, this embodiment is arranged to alternately perform and shut off supply of each of the first process gas (DCS) and third process gas ($C_2H_4$), while continuously performing supply of the second process gas ($NH_3$). Further, although not shown in the drawings, the modification 3 of the eighth embodiment is arranged such that only the last purge step P2 in FIG. 11A is omitted.

Ninth Embodiment

Figure 12A:
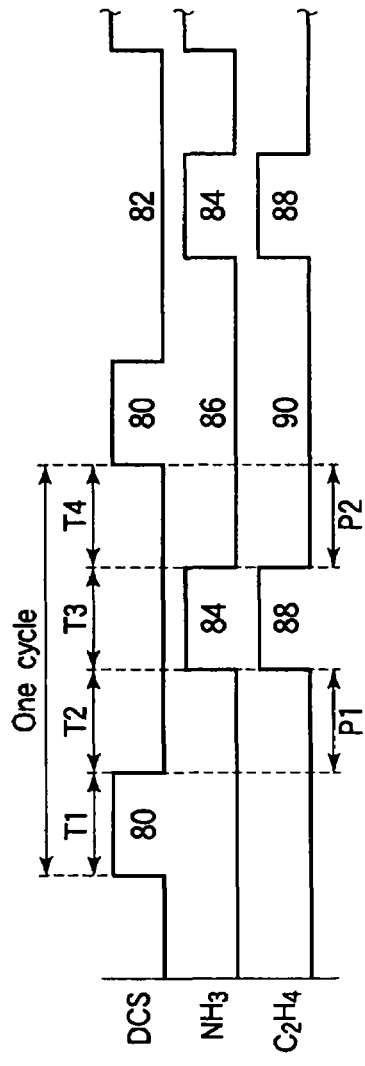
FIGS. 12A, 12B, and 12C are timing charts showing the gas supply of film formation methods according to a ninth embodiment of the present invention and modifications thereof.

FIG. 12A is a timing chart showing the gas supply of a film formation method according to a ninth embodiment of the present invention. As shown in FIG. 12A, the film formation method according to this embodiment is arranged to be the same as that of the first embodiment shown in FIG. 3A except that supply of the third process gas ($C_2H_4$ supply) is performed in the third period T3 in place of the first period T1.

This embodiment can also provide the same effect as the first embodiment, i.e., although the film formation temperature is set to be lower, it is possible to introduce a larger amount of carbon into the formed SiCN film.

Figure 12B:
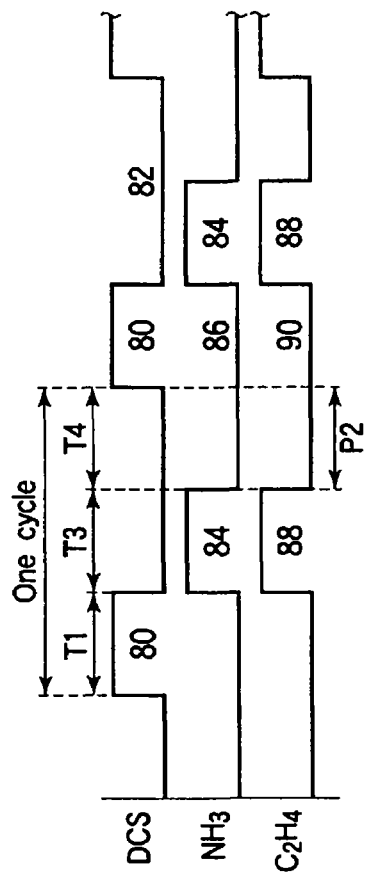

The timing chart shown in FIG. 12A includes two purge steps P1 and P2, but they may be partly or wholly omitted. FIG. 12B shows a timing chart of a modification 1 of the ninth embodiment, in which the first purge step P1 in FIG. 12A is omitted. In this case, one cycle is formed of the periods T1, T3, and T4. Specifically, the first process gas supply step 80 is directly followed by the second and third process gas supply steps 84 and 88 performed together, with no purge step interposed therebetween, and then the purge step P2 is performed.

Figure 12C:
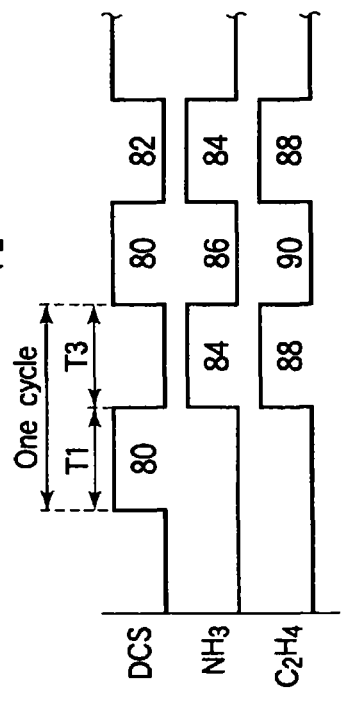

FIG. 12C shows a timing chart of a modification 2 of the ninth embodiment, in which the two purge steps P1 and P2 in FIG. 12A are omitted. In this case, one cycle is formed of the periods T1 and T3. Specifically, one cycle is completed such that the first process gas supply step 80 is directly followed by the second and third process gas supply steps 84 and 88 performed together, with no purge step interposed therebetween. Further, although not shown in the drawings, the modification 3 of the ninth embodiment is arranged such that only the last purge step P2 in FIG. 12A is omitted.

Tenth Embodiment

Figure 13A:
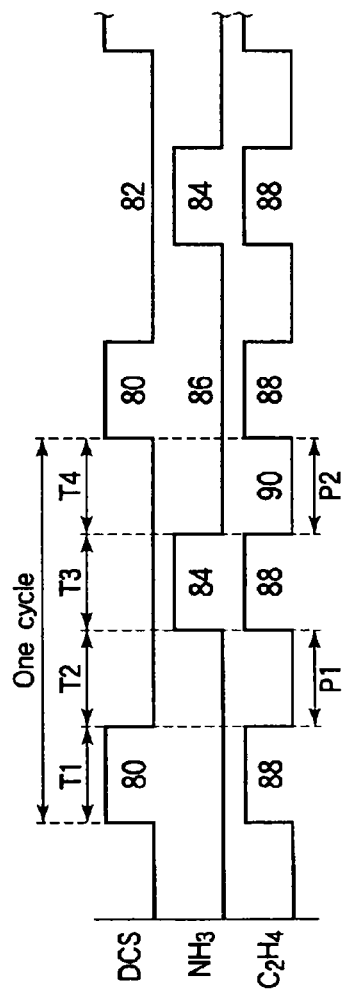
FIGS. 13A, 13B, and 13C are timing charts showing the gas supply of film formation methods according to a tenth embodiment of the present invention and modifications thereof.

FIG. 13A is a timing chart showing the gas supply of a film formation method according to a tenth embodiment of the present invention. As shown in FIG. 13A, the film formation method according to this embodiment is arranged to be the same as that of the first embodiment shown in FIG. 3A except that supply of the third process gas ($C_2H_4$ supply) is performed not only in the first period T1 but also in the third period T3. In other words, the third process gas supply step 88 is performed twice (a plurality of times) in one cycle. The number of this plurality of times may be further increased.

This embodiment can also provide the same effect as the first embodiment, i.e., although the film formation temperature is set to be lower, it is possible to introduce a larger amount of carbon into the formed SiCN film.

Figure 13B:
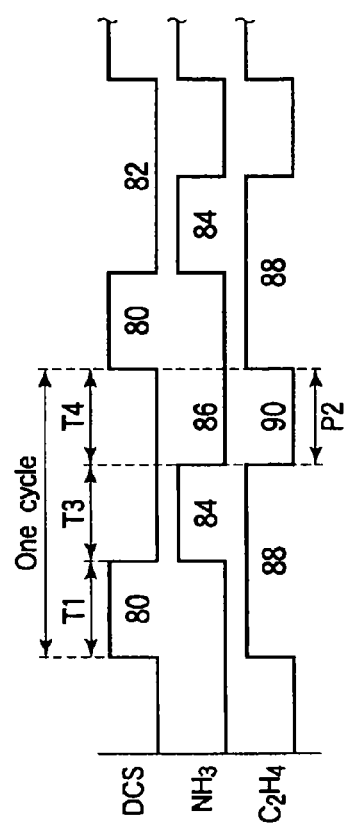

The timing chart shown in FIG. 13A includes two purge steps P1 and P2, but they may be partly or wholly omitted. FIG. 13B shows a timing chart of a modification 1 of the tenth embodiment, in which the first purge step P1 in FIG. 13A is omitted. In this case, one cycle is formed of the periods T1, T3, and T4. Specifically, the first and third process gas supply steps 80 and 88 performed together are directly followed by the second and third process gas supply steps 84 and 88 performed together, with no purge step interposed therebetween, and then the purge step P2 is performed.

Figure 13C:
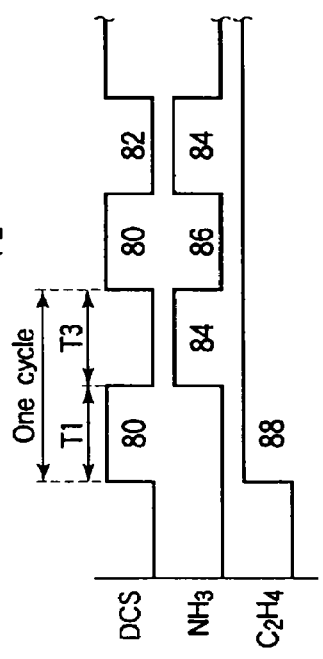

FIG. 13C shows a timing chart of a modification 2 of the tenth embodiment, in which the two purge steps P1 and P2 in FIG. 13A are omitted. In this case, one cycle is formed of the periods T1 and T3. Specifically, this embodiment is arranged to alternately perform and shut off supply of each of the first process gas (DCS) and the second process gas ($NH_3$), while continuously performing supply of the third process gas ($C_2H_4$). Further, although not shown in the drawings, the modification 3 of the tenth embodiment is arranged such that only the last purge step P2 in FIG. 13A is omitted.

<Modification of Film Formation Apparatus>

Figure 14:
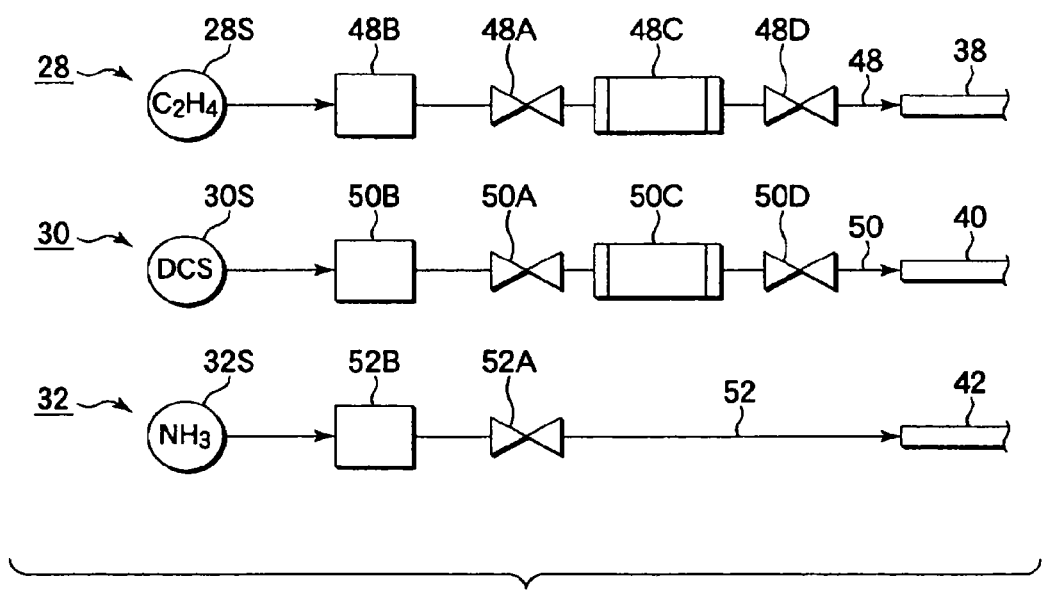
FIG. 14 is a structural view showing part of gas supply circuits used in a film formation apparatus according to a modification.

FIG. 14 is a structural view showing part of gas supply circuits used in a film formation apparatus according to a modification. As shown in FIG. 14, the gas passage 48 of the third process gas supply circuit 28 is provided with a storage tank 48C having a certain volume and a second switching valve 48D in this order, downstream from the flow rate controller 48B and switching valve 48A. The gas passage 50 of the first process gas supply circuit 30 is provided with a storage tank 50C having a certain volume and a second switching valve 50D in this order, downstream from the flow rate controller 50B and switching valve 50A. Each of the storage tanks 48C and 50C has a volume of, e.g., about 200 to 5,000 milliliters.

According to this modification, a film formation method may be arranged to store in the storage tank 48C or 50C a process gas in an amount to be subsequently supplied to the process field 5, while shutting off supply of the process gas to the process field 5, and to then supply the gas thus stored in the storage tank 48C or 50C to the process field 5 at once in the next supply step. In this case, a larger amount of process gas can be supplied to the process field 5 in a shorter time, thereby decreasing the adsorption time. Switching between start and stop of supply of the process gas to the process field 5 is performed by opening/closing of the second switching valve 48D or 50D, while switching between start and stop of storing of the process gas in the storage tank 48C or 50C is performed by opening/closing of the upstream switching valve 48A or 50A. The opening/closing of the second switching valve 48D or 50 is controlled by the control section 74 (see FIG. 1). The upstream switching valve 48A or 50A may be set in a normally open state or set in an open state only when storing the gas in the storage tank 48C or 50C.

In this modification, both of the gas passage 48 of the third process gas supply circuit 28 and the gas passage 50 of the first process gas supply circuit 30 are respectively provided with the storage tanks 48C and 50C and switching valves 48D and 50D. However, only one of the gas passages is provided with a storage tank. Whether or not the storage tanks 48C and 50C are disposed may be determined in accordance with the manners of supply of the process gases. Where one of the storage tanks 48C and 50C is omitted, a film formation method according to each of the following embodiments is altered not to perform the storage step of the corresponding process gas.

Eleventh Embodiment

Figure 15A:
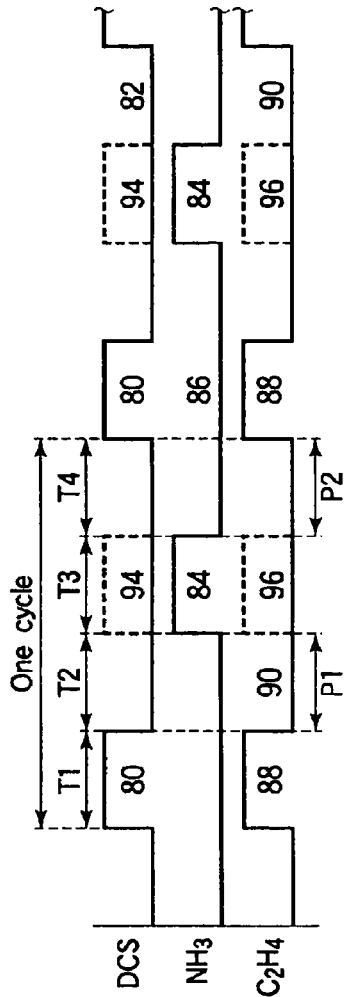
FIGS. 15A, 15B, and 15C are timing charts showing the gas supply of film formation methods according to an eleventh embodiment of the present invention and modifications thereof.

FIG. 15A is a timing chart showing the gas supply of a film formation method according to an eleventh embodiment of the present invention. As shown in FIG. 15A, the film formation method according to this embodiment is arranged to alternately repeat first to fourth periods T1 to T4, as in the first embodiment shown in FIG. 3A. A cycle comprising the first to fourth periods T1 to T4 is repeated a number of times, and thin films of SiCN formed by respective times are laminated, thereby arriving at an SiCN film having a target thickness.

Specifically, the first period T1 is arranged to perform supply of the first and third process gases (DCS and $C_2H_4$) to the process field 5 (first and third process gas supply steps 80 and 88), while shutting off supply of the second process gas ($NH_3$) to the process field 5. The second period T2 is arranged to shut off supply of the first, second, and third process gases to the process field 5 (purge step P1). The third period T3 is arranged to perform supply of the second process gas to the process field 5 (second process gas supply step 84), while shutting off supply of the first and third process gases to the process field 5. The fourth period T4 is arranged to shut off supply of the first, second, and third process gases to the process field 5 (purge step P2).

Further, within a first process gas shutoff step 82 of shutting off supply of the first process gas to the process field 5, a first process gas storage step 94 of storing the first process gas in the storage tank 50C is performed. Similarly, within a third process gas shutoff step 90 of shutting off supply of the third process gas to the process field 5, a third process gas storage step 96 of storing the third process gas in the storage tank 48C is performed.

In the timing chart shown in FIG. 15A, the first and third process gas storage steps 94 and 96 are performed in the third period T3, but the steps 94 and 96 can be performed in any timing within the first and third process gas shutoff steps 82 and 90, respectively. Specifically, each of the first and third process gas storage steps 94 and 96 can be set at any position and can have any length within the second to fourth periods T2 to T4. For the first cycle, the respective process gases are preferably stored in the storage tanks 50C and 48C in advance. These matters are common to the following twelfth to twentieth embodiments.

As described above, this film formation method is arranged to store in the storage tanks 50C and 48C the first and third process gases each in an amount to be subsequently supplied to the process field 5, while shutting off supply of the first and third process gases to the process field 5, and to then supply the gases thus stored in the storage tank tanks 50C and 48C to the process field 5 at once in the next supply step. In this case, a larger amount of process gases can be supplied to the process field 5 in a shorter time, thereby decreasing the adsorption time (the length of the period T1) and improving the throughput. Further, when the first and third process gases are supplied to the process field 5, the opening degree of the pressure adjustment valve (valve unit 78 in FIG. 1) on the exhaust passage may be set smaller to increase the gas amount in the process container 4.

Figure 15B:
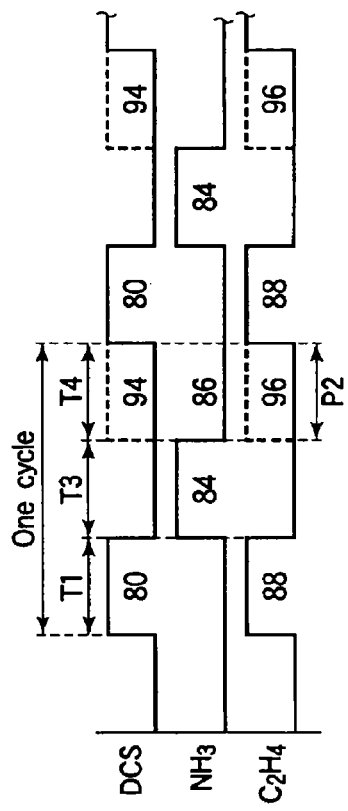

FIG. 15B shows a timing chart of a modification 1 of the eleventh embodiment, in which the first purge step P1 in FIG. 15A is omitted. In this case, one cycle is formed of the periods T1, T3, and T4. The first and third process gas storage steps 94 and 96 are performed in the fourth period T4.

Figure 15C:
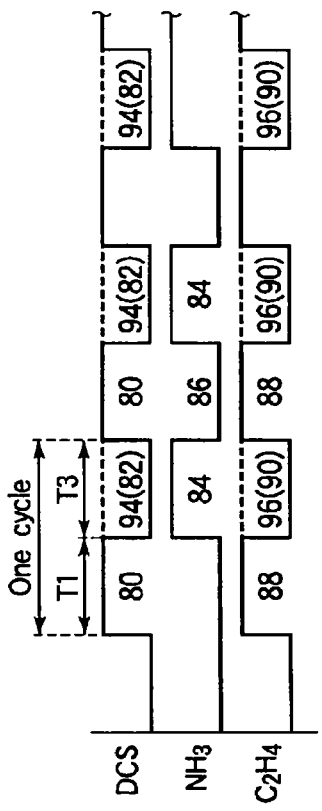

FIG. 15C shows a timing chart of a modification 2 of the eleventh embodiment, in which the two purge steps P1 and P2 in FIG. 15A are omitted. In this case, one cycle is formed of the periods T1 and T3. The first and third process gas storage steps 94 and 96 are performed in the fourth period T3.

Twelfth Embodiment

Figure 16A:
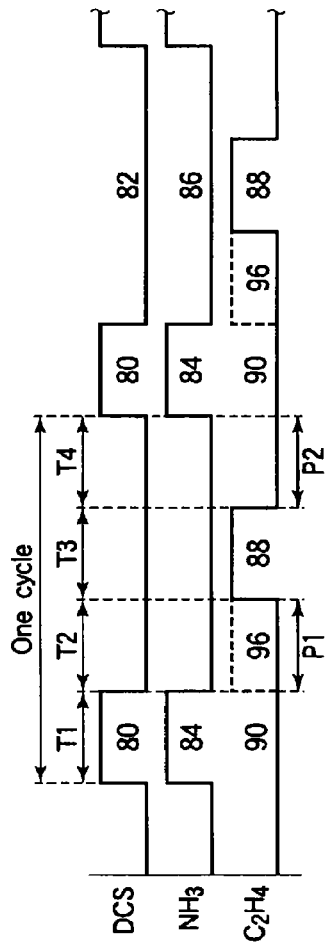
FIGS. 16A, 16B, and 16C are timing charts showing the gas supply of film formation methods according to a twelfth embodiment of the present invention and modifications thereof.

FIG. 16A is a timing chart showing the gas supply of a film formation method according to a twelfth embodiment of the present invention. As shown in FIG. 16A, the film formation method according to this embodiment is arranged such that supply of the first process gas (DCS supply) is performed in the same timing as the eleventh embodiment shown in FIG. 15A, and supply of the second process gas ($NH_3$ supply) and supply of the third process gas ($C_2H_4$ supply) are performed in timings exchanged with each other as compared to the method shown in FIG. 15A. Further, the first process gas storage step 94 is not performed while the third process gas storage step 96 is performed in the second period T2.

Figure 16B:
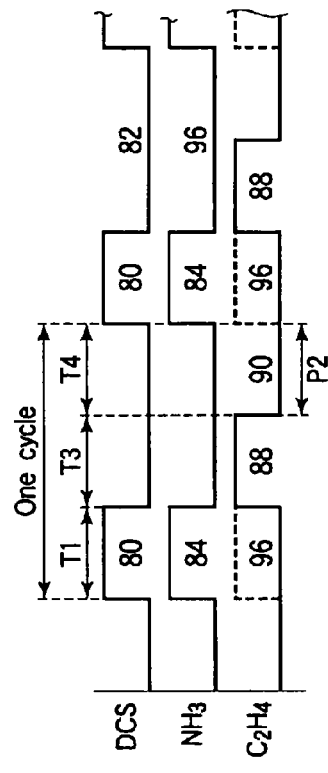

FIG. 16B shows a timing chart of a modification 1 of the twelfth embodiment, in which the first purge step P1 in FIG. 16A is omitted. In this case, one cycle is formed of the periods T1, T3, and T4. The third process gas storage step 96 is performed in the first period T1.

Figure 16C:
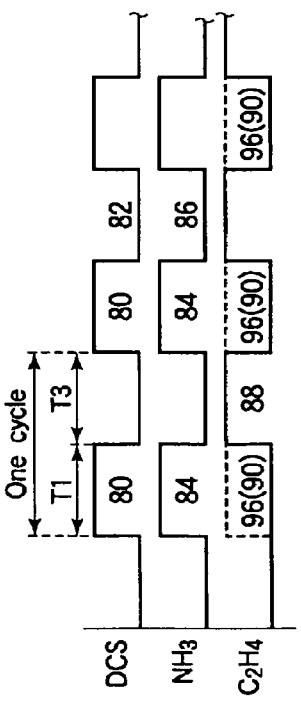

FIG. 16C shows a timing chart of a modification 2 of the twelfth embodiment, in which the two purge steps P1 and P2 in FIG. 16A are omitted. In this case, one cycle is formed of the periods T1 and T3. The third process gas storage step 96 is performed in the first period T1.

This embodiment can also provide the same effect as the eleventh embodiment. Further, this embodiment may also be arranged to utilize the first process gas storage step 94, as described in the eleventh embodiment.

Thirteenth Embodiment

Figure 17A:
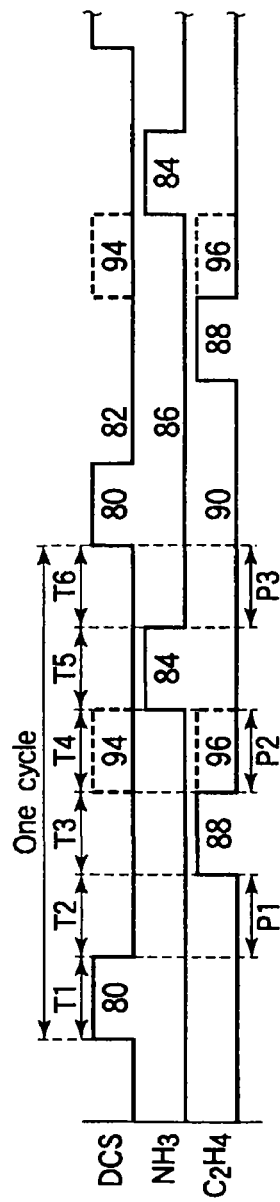
FIGS. 17A, 17B, 17C, and 17D are timing charts showing the gas supply of film formation methods according to a thirteenth embodiment of the present invention and modifications thereof.

FIG. 17A is a timing chart showing the gas supply of a film formation method according to a thirteenth embodiment of the present invention. As shown in FIG. 17A, the film formation method according to this embodiment is arranged to alternately repeat first to sixth periods T1 to T6, as in the third embodiment shown in FIG. 6A. A cycle comprising the first to sixth periods T1 to T6 is repeated a number of times, and thin films of SiCN formed by respective times are laminated, thereby arriving at an SiCN film having a target thickness.

Specifically, the first period T1 is arranged to perform supply of the first process gas to the process field 5 (first process gas supply step 80), while shutting off supply of the second and third process gases to the process field 5. The second period T2 is arranged to shut off supply of the first, second, and third process gases to the process field 5 (purge step P1). The third period T3 is arranged to perform supply of the third process gas to the process field 5 (third process gas supply step 88), while shutting off supply of the first and second process gases to the process field 5. The fourth period T4 is arranged to shut off supply of the first, second, and third process gases to the process field 5 (purge step P2). The fifth period T5 is arranged to perform supply of the second process gas to the process field 5 (second process gas supply step 84), while shutting off supply of the first and third process gases to the process field 5. The sixth period T6 is arranged to shut off supply of the first, second, and third process gases to the process field 5 (purge step P3).

Further, within a first process gas shutoff step 82 of shutting off supply of the first process gas to the process field 5, a first process gas storage step 94 of storing the first process gas in the storage tank 50C is performed. Similarly, within a third process gas shutoff step 90 of shutting off supply of the third process gas to the process field 5, a third process gas storage step 96 of storing the third process gas in the storage tank 48C is performed.

In the timing chart shown in FIG. 17A, the first and third process gas storage steps 94 and 96 are performed in the fourth period T4, but the steps 94 and 96 can be performed in any timing within the first and third process gas shutoff steps 82 and 90, respectively. Specifically, each of the first and third process gas storage steps 94 and 96 can be set at any position and can have any length within the second to sixth periods T2 to T6.

Figure 17B:
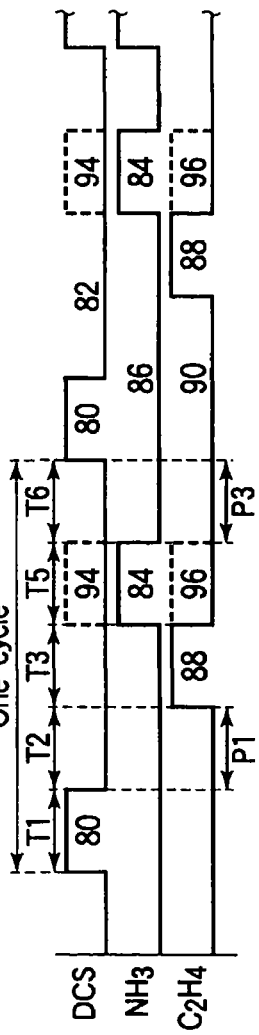

FIG. 17B shows a timing chart of a modification 1 of the thirteenth embodiment, in which the second purge step P2 in FIG. 17A is omitted. In this case, one cycle is formed of the periods T1, T2, T3, T5, and T6. The first and third process gas storage steps 94 and 96 are performed in the fifth period T5.

Figure 17C:
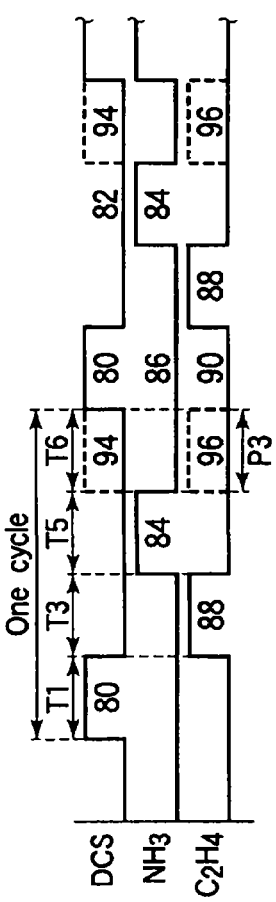

FIG. 17C shows a timing chart of a modification 2 of the thirteenth embodiment, in which the first and second purge steps P1 and P2 in FIG. 17A are omitted. In this case, one cycle is formed of the periods T1, T3, T5, and T6. The first and third process gas storage steps 94 and 96 are performed in the sixth period T6.

Figure 17D:
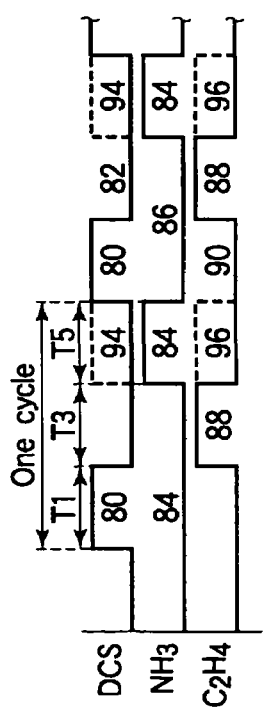

FIG. 17D shows a timing chart of a modification 3 of the thirteenth embodiment, in which the first to third purge steps P1 to P3 in FIG. 17A are omitted. In this case, one cycle is formed of the periods T1, T3, and T5. The first and third process gas storage steps 94 and 96 are performed in the fifth period T5.

This embodiment can also provide the same effect as the eleventh embodiment.

Fourteenth Embodiment

Figure 18A:
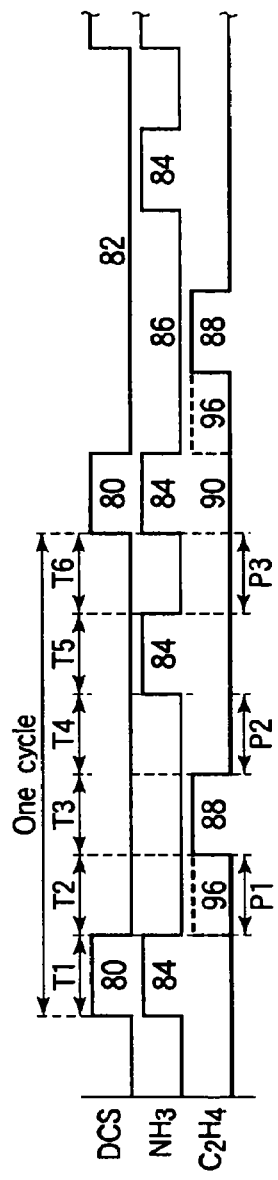
FIGS. 18A, 18B, 18C, and 18D are timing charts showing the gas supply of film formation methods according to a fourteenth embodiment of the present invention and modifications thereof.

FIG. 18A is a timing chart showing the gas supply of a film formation method according to a fourteenth embodiment of the present invention. As shown in FIG. 18A, the film formation method according to this embodiment is arranged to be the same as that of the thirteenth embodiment shown in FIG. 17A except that supply of the second process gas ($NH_3$ supply) is performed not only in the fifth period T5 but also in the first period T1, and the first process gas storage step 94 is not performed while the third process gas storage step 96 is performed in the second period T2.

Figure 18B:
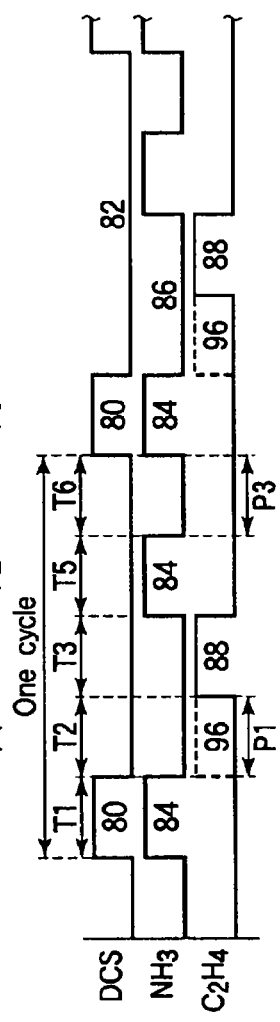

FIG. 18B shows a timing chart of a modification 1 of the fourteenth embodiment, in which the second purge step P2 in FIG. 18A is omitted. In this case, one cycle is formed of the periods T1, T2, T3, T5, and T6. The third process gas storage step 96 is performed in the second period T2.

Figure 18C:
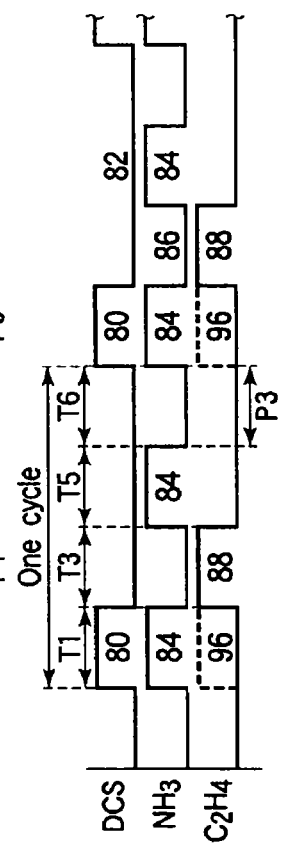

FIG. 18C shows a timing chart of a modification 2 of the fourteenth embodiment, in which the first and second purge steps P1 and P2 in FIG. 18A are omitted. In this case, one cycle is formed of the periods T1, T3, T5, and T6. The third process gas storage step 96 is performed in the first period T1.

Figure 18D:
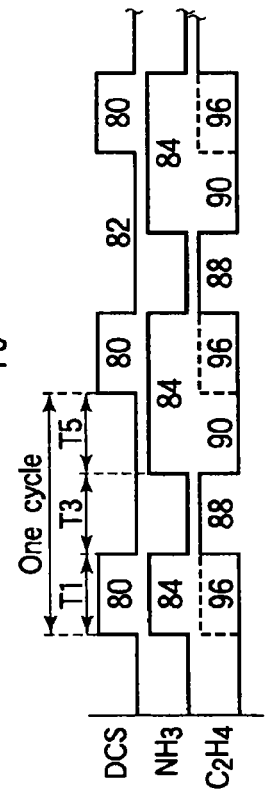

FIG. 18D shows a timing chart of a modification 3 of the fourteenth embodiment, in which the first to third purge steps P1 to P3 in FIG. 18A are omitted. In this case, one cycle is formed of the periods T1, T3, and T5. The third process gas storage step 96 is performed in the first period T1.

This embodiment can also provide the same effect as the eleventh embodiment. Further, this embodiment may also be arranged to utilize the first process gas storage step 94, as described in the eleventh embodiment.

Fifteenth Embodiment

Figure 19A:
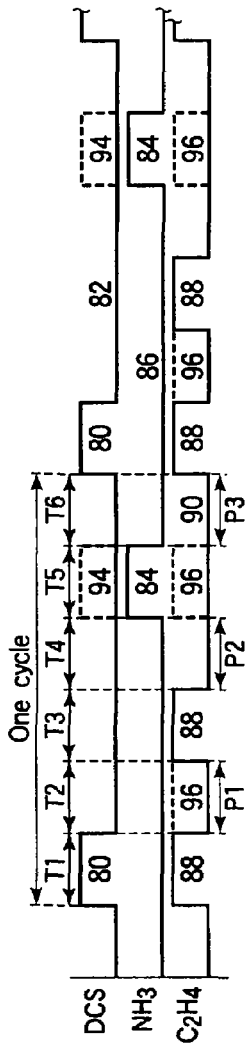
FIGS. 19A, 19B, 19C, and 19D are timing charts showing the gas supply of film formation methods according to a fifteenth embodiment of the present invention and modifications thereof.

FIG. 19A is a timing chart showing the gas supply of a film formation method according to a fifteenth embodiment of the present invention. As shown in FIG. 19A, the film formation method according to this embodiment is arranged to be the same as that of the thirteenth embodiment shown in FIG. 17A except that supply of the third process gas ($C_2H_4$ supply) is performed not only in the third period T3 but also in the first period T1, and the first process gas storage step 94 is performed in the fifth period T5 while the third process gas storage step 96 is performed in the second and fifth periods T2 and T5. In this case, the second period T2 needs to include the third process gas storage step 96 in preparation for the third process gas supply step 88 immediately thereafter.

Figure 19B:
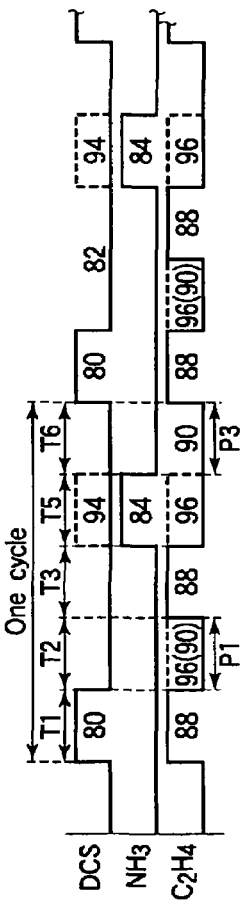

FIG. 19B shows a timing chart of a modification 1 of the fifteenth embodiment, in which the second purge step P2 in FIG. 19A is omitted. In this case, one cycle is formed of the periods T1, T2, T3, T5, and T6. The first process gas storage step 94 is performed in the fifth period T5 while the third process gas storage step 96 is performed in the second and fifth periods T2 and T5.

Figure 19C:
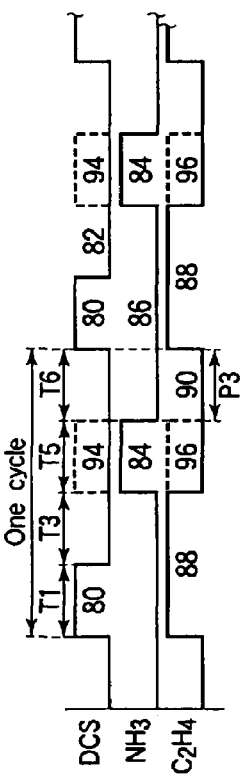

FIG. 19C shows a timing chart of a modification 2 of the fifteenth embodiment, in which the first and second purge steps P1 and P2 in FIG. 19A are omitted. In this case, one cycle is formed of the periods T1, T3, T5, and T6. The first and third process gas storage steps 94 and 96 are performed only in the fifth period T5.

Figure 19D:
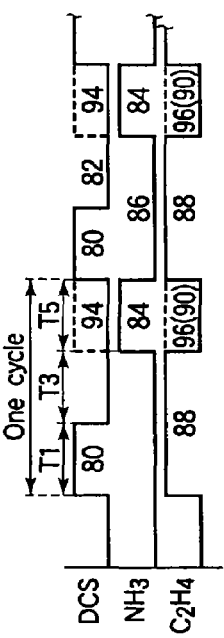

FIG. 19D shows a timing chart of a modification 3 of the fifteenth embodiment, in which the first to third purge steps P1 to P3 in FIG. 19A are omitted. In this case, one cycle is formed of the periods T1, T3, and T5. The first and third process gas storage steps 94 and 96 are performed only in the fifth period T5.

This embodiment can also provide the same effect as the eleventh embodiment.

Sixteenth Embodiment

Figure 20A:
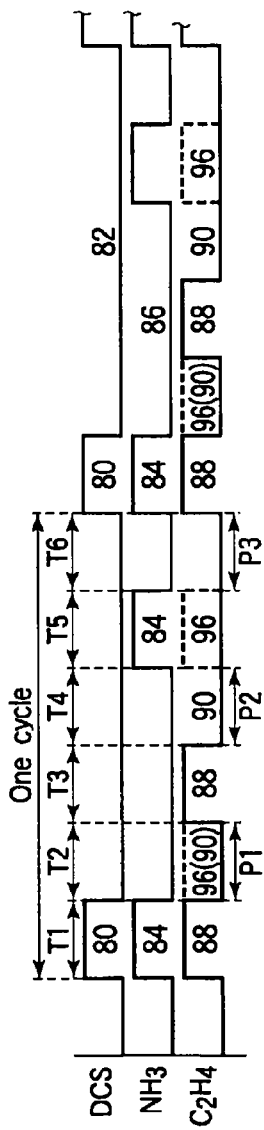
FIGS. 20A, 20B, 20C, and 20D are timing charts showing the gas supply of film formation methods according to a sixteenth embodiment of the present invention and modifications thereof.

FIG. 20A is a timing chart showing the gas supply of a film formation method according to a sixteenth embodiment of the present invention. As shown in FIG. 20A, the film formation method according to this embodiment is arranged to be the same as that of the thirteenth embodiment shown in FIG. 17A except that supply of the second process gas ($NH_3$ supply) is performed not only in the fifth period T5 but also in the first period T1, supply of the third process gas ($C_2H_4$ supply) is performed not only in the third period T3 but also in the first period T1, and the first process gas storage step 94 is not performed while the third process gas storage step 96 is performed in the second and fifth periods T2 and T5. In this case, the second period T2 needs to include the third process gas storage step 96 in preparation for the third process gas supply step 88 immediately thereafter.

Figure 20B:
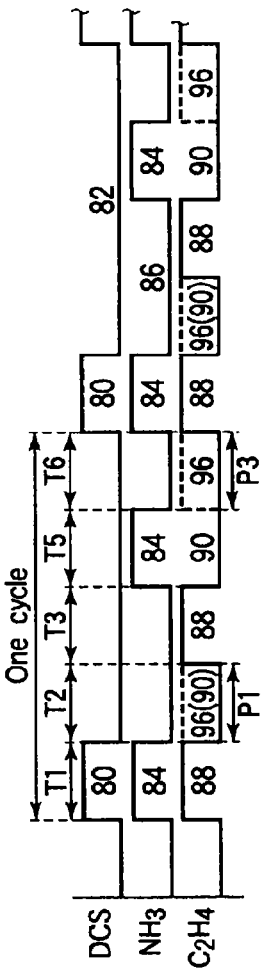

FIG. 20B shows a timing chart of a modification 1 of the sixteenth embodiment, in which the second purge step P2 in FIG. 20A is omitted. In this case, one cycle is formed of the periods T1, T2, T3, T5, and T6. The third process gas storage step 96 is performed in the second and sixth periods T2 and T6.

Figure 20C:
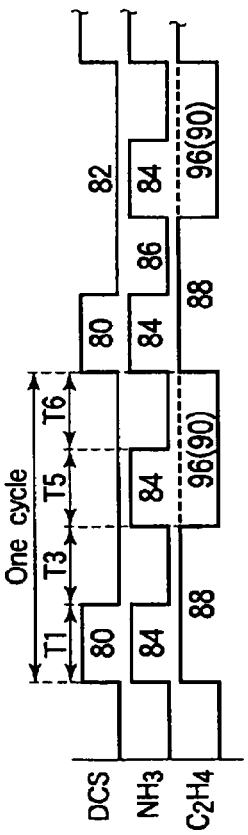

FIG. 20C shows a timing chart of a modification 2 of the sixteenth embodiment, in which the first and second purge steps P1 and P2 in FIG. 20A are omitted. In this case, one cycle is formed of the periods T1, T3, T5, and T6. The third process gas storage step 96 is performed in the fifth and sixth periods T5 and T6.

Figure 20D:
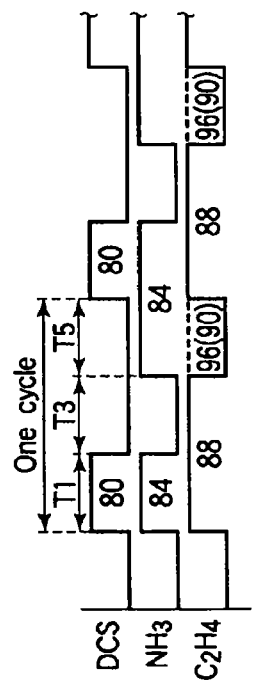

FIG. 20D shows a timing chart of a modification 3 of the sixteenth embodiment, in which the first to third purge steps P1 to P3 in FIG. 20A are omitted. In this case, one cycle is formed of the periods T1, T3, and T5. The third process gas storage step 96 is performed only in the fifth period T5.

This embodiment can also provide the same effect as the eleventh embodiment. Further, this embodiment may also be arranged to utilize the first process gas storage step 94, as described in the eleventh embodiment.

Seventeenth Embodiment

Figure 21A:
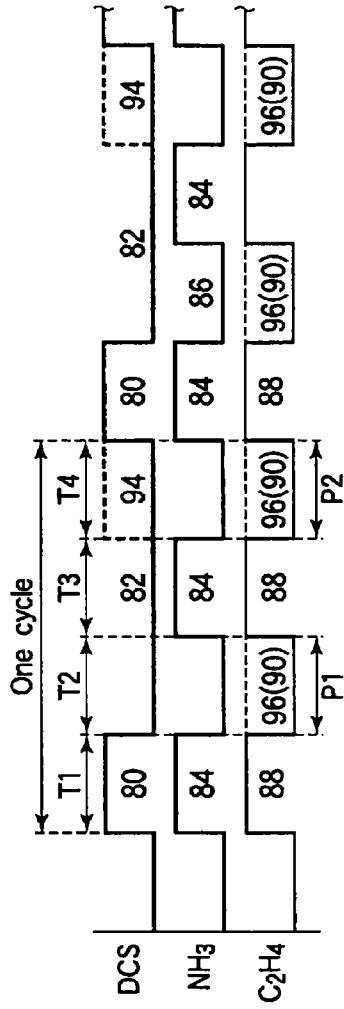
FIGS. 21A, 21B, and 21C are timing charts showing the gas supply of film formation methods according to a seventeenth embodiment of the present invention and modifications thereof.

FIG. 21A is a timing chart showing the gas supply of a film formation method according to a seventeenth embodiment of the present invention. As shown in FIG. 21A, the film formation method according to this embodiment is arranged to be the same as that of the eleventh embodiment shown in FIG. 15A except that supply of the second process gas ($NH_3$ supply) is performed not only in the third period T3 but also in the first period T1, supply of the third process gas ($C_2H_4$ supply) is performed not only in the first period T1 but also in the third period T3, and the first process gas storage step 94 is performed in the fourth period T4 while the third process gas storage step 96 is performed in the second and fourth periods T2 and T4. In this case, the second period T2 needs to include the third process gas storage step 96 in preparation for the third process gas supply step 88 immediately thereafter.

Figure 21B:
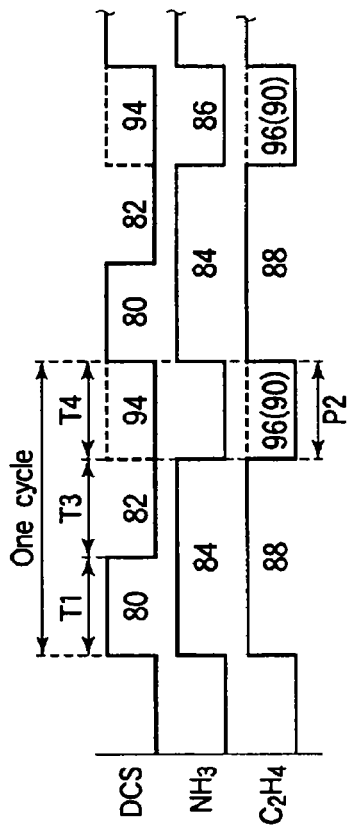

FIG. 21B shows a timing chart of a modification 1 of the seventeenth embodiment, in which the first purge step P1 in FIG. 21A is omitted. In this case, one cycle is formed of the periods T1, T3, and T4. The first and third process gas storage steps 94 and 96 are performed only in the fourth period T4.

Figure 21C:
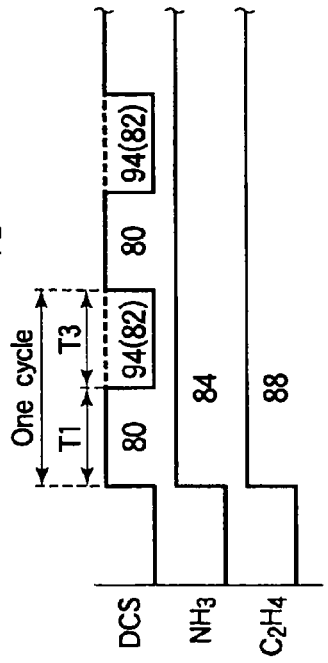

FIG. 21C shows a timing chart of a modification 2 of the seventeenth embodiment, in which the two purge steps P1 and P2 in FIG. 21A are omitted. In this case, one cycle is formed of the periods T1 and T3. Specifically, this embodiment is arranged to alternately perform and shut off supply of the first process gas (DCS), while continuously performing supply of the second process gas ($NH_3$) and third process gas ($C_2H_4$). Accordingly, only the first process gas storage step 94 is performed in the third period T3.

This embodiment can also provide the same effect as the eleventh embodiment.

Eighteenth Embodiment

Figure 22A:
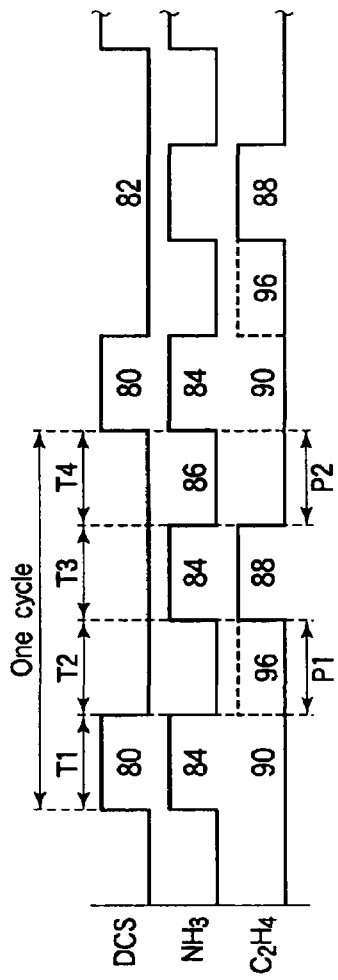
FIGS. 22A, 22B, and 22C are timing charts showing the gas supply of film formation methods according to an eighteenth embodiment of the present invention and modifications thereof.

FIG. 22A is a timing chart showing the gas supply of a film formation method according to an eighteenth embodiment of the present invention. As shown in FIG. 22A, the film formation method according to this embodiment is arranged to be the same as that of the twelfth embodiment shown in FIG. 16A except that supply of the second process gas ($NH_3$ supply) is performed not only in the first period T1 but also in the third period T3. The first process gas storage step 94 is not performed while the third process gas storage step 96 is performed in the second period T2.

Figure 22B:
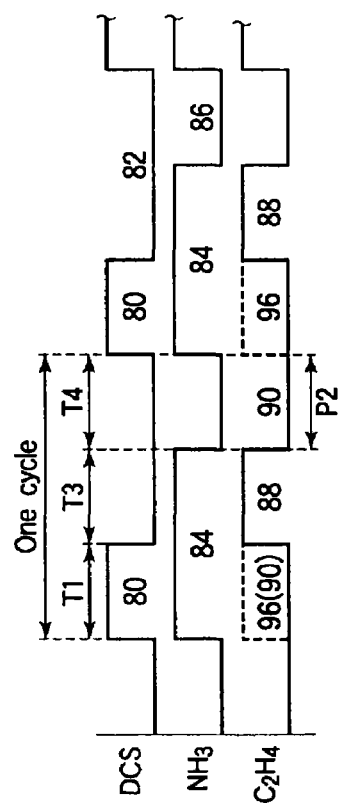

FIG. 22B shows a timing chart of a modification 1 of the eighteenth embodiment, in which the first purge step P1 in FIG. 22A is omitted. In this case, one cycle is formed of the periods T1, T3, and T4. The third process gas storage step 96 is performed in the first period T1.

Figure 22C:
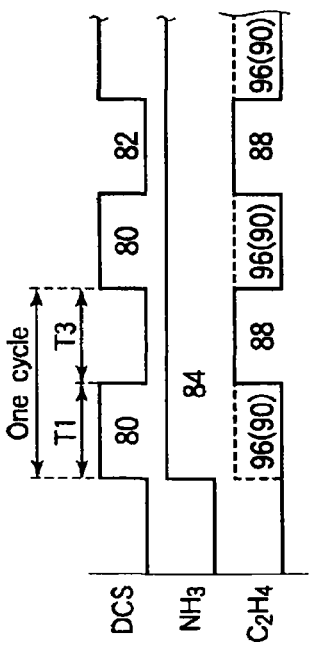

FIG. 22C shows a timing chart of a modification 2 of the eighteenth embodiment, in which the two purge steps P1 and P2 in FIG. 22A are omitted. In this case, one cycle is formed of the periods T1 and T3. The third process gas storage step 96 is performed in the first period T1.

This embodiment can also provide the same effect as the eleventh embodiment. Further, this embodiment may also be arranged to utilize the first process gas storage step 94, as described in the eleventh embodiment.

Nineteenth Embodiment

Figure 23A:
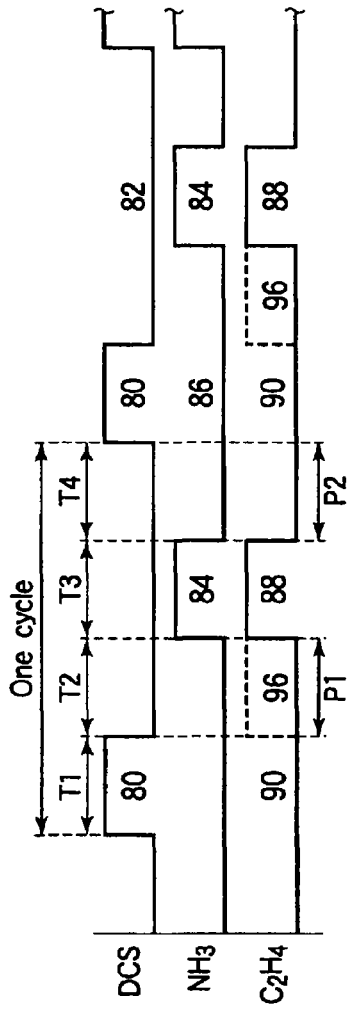
FIGS. 23A, 23B, and 23C are timing charts showing the gas supply of film formation methods according to a nineteenth embodiment of the present invention and modifications thereof.

FIG. 23A is a timing chart showing the gas supply of a film formation method according to a nineteenth embodiment of the present invention. As shown in FIG. 23A, the film formation method according to this embodiment is arranged to be the same as that of the eleventh embodiment shown in FIG. 15A except that supply of the third process gas ($C_2H_4$ supply) is performed in the third period T3 in place of the first period T1, and the first process gas storage step 94 is not performed while the third process gas storage step 96 is performed in the second period T2.

Figure 23B:
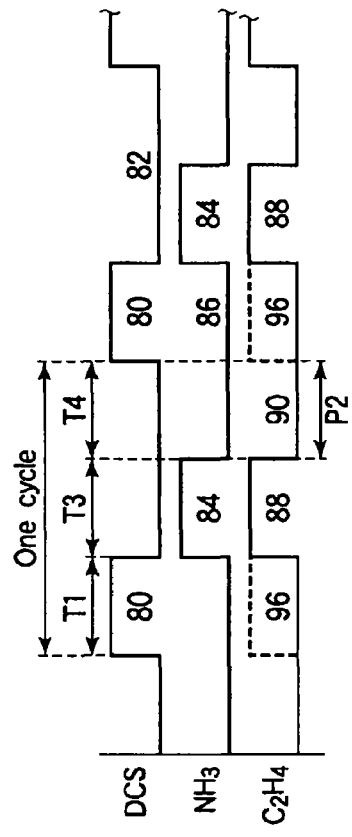

FIG. 23B shows a timing chart of a modification 1 of the nineteenth embodiment, in which the first purge step P1 in FIG. 23A is omitted. In this case, one cycle is formed of the periods T1, T3, and T4. The third process gas storage step 96 is performed in the first period T1.

Figure 23C:
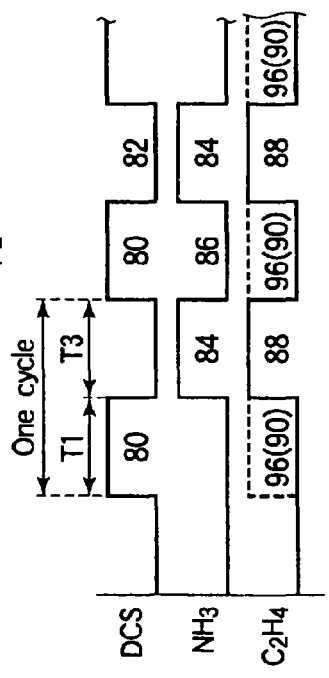

FIG. 23C shows a timing chart of a modification 2 of the nineteenth embodiment, in which the two purge steps P1 and P2 in FIG. 23A are omitted. In this case, one cycle is formed of the periods T1 and T3. The third process gas storage step 96 is performed in the first period T1.

This embodiment can also provide the same effect as the eleventh embodiment. Further, this embodiment may also be arranged to utilize the first process gas storage step 94, as described in the eleventh embodiment.

Twentieth Embodiment

Figure 24A:
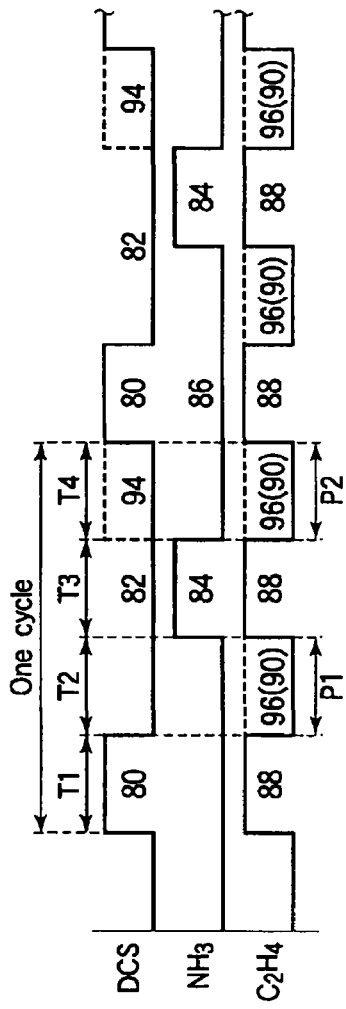
FIGS. 24A, 24B, and 24C are timing charts showing the gas supply of film formation methods according to a twentieth embodiment of the present invention and modifications thereof.

FIG. 24A is a timing chart showing the gas supply of a film formation method according to a twentieth embodiment of the present invention. As shown in FIG. 24A, the film formation method according to this embodiment is arranged to be the same as that of the eleventh embodiment shown in FIG. 15A except that supply of the third process gas ($C_2H_4$ supply) is performed not only in the first period T1 but also in the third period T3, and the first process gas storage step 94 is performed in the fourth period T4 while the third process gas storage step 96 is performed in the second and fourth periods T2 and T4. In this case, the second period T2 needs to include the third process gas storage step 96 in preparation for the third process gas supply step 88 immediately thereafter.

Figure 24B:
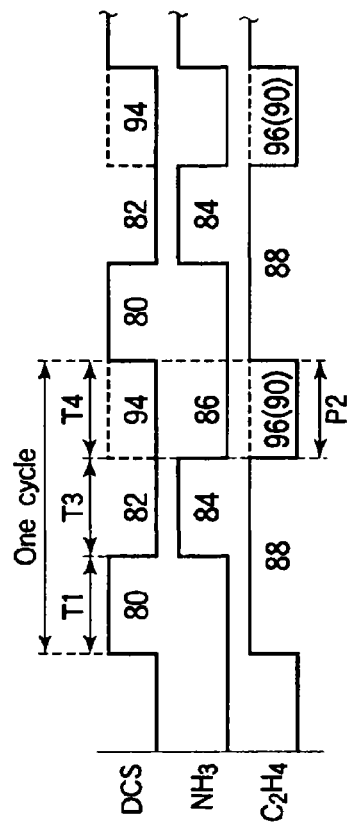

FIG. 24B shows a timing chart of a modification 1 of the twentieth embodiment, in which the first purge step P1 in FIG. 24A is omitted. In this case, one cycle is formed of the periods T1, T3, and T4. The first and third process gas storage steps 94 and 96 are performed only in the fourth period T4.

Figure 24C:
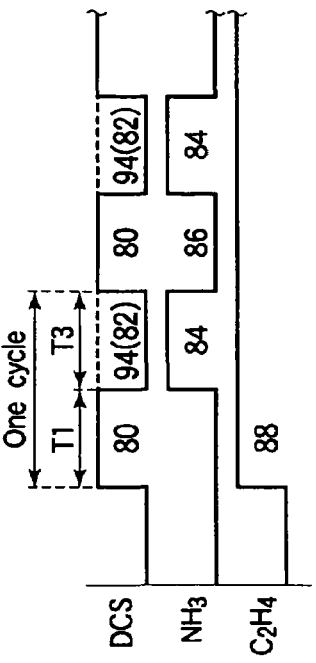

FIG. 24C shows a timing chart of a modification 2 of the twentieth embodiment, in which the two purge steps P1 and P2 in FIG. 24A are omitted. In this case, one cycle is formed of the periods T1 and T3. Specifically, this embodiment is arranged to alternately perform and shut off supply of each of the first process gas (DCS) and the second process gas ($NH_3$), while continuously performing supply of the third process gas ($C_2H_4$). Accordingly, the first process gas storage step 94 is performed only in the third period T3.

This embodiment can also provide the same effect as the eleventh embodiment.

<Common Matters to First to Twentieth Embodiments>

The embodiments described above are exemplified by a case where an SiCN film is formed, but the film may be further doped with an impurity, such as B (boron). The embodiments described above are exemplified by a case where each cycle is arranged to supply the first process gas (DCS) at first, but each cycle may be arranged to supply the second process gas ($NH_3$) or third process gas ($C_2H_4$) at first.

The apparatus shown in FIGS. 1 and 2 includes the nozzle reception recess 60 formed on the sidewall of the process container 4 to accommodate the nozzles 38, 40, and 42. However, where a space sufficient to accommodate the nozzles is present between the process container 4 and the edges of wafers, the nozzle reception recess 60 may be omitted.

The film formation apparatus shown in FIGS. 1 and 2 is of the single-tube type, but a film formation apparatus of the double-tube type, which includes inner and out tubes concentrically arranged, may be employed. The gas flow inside the process container is not limited to a cross flow. For example, the present invention may be applied to a film formation apparatus having a vertical process container in which gas is supplied from one end in the vertical direction and exhausted from the other end to form a vertical flow. The apparatus shown in FIGS. 1 and 2 is a film formation apparatus of the batch type for processing a plurality of wafers all together. Alternatively, the present invention may be applied to a film formation apparatus of the single-substrate type for processing wafers one by one.

In the embodiments described above, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertialbutylaminosilane (BTBAS), and diisopropylaminosilane (DIPAS).

In the embodiments described above, the second process gas contains $NH_3$ gas as a nitriding gas. In this respect, the nitriding gas may be one or more gases selected from the group consisting of ammonia ($NH_3$), nitrogen ($N_2$), dinitrogen oxide ($N_2O$), and nitrogen oxide (NO).

In the embodiments described above, the third process gas contains ethylene gas as a carbon hydride gas. In this respect, the carbon hydride gas may be one or more gases selected from the group consisting of acetylene, ethylene, methane, ethane, propane, and butane.

A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming an SiCN film having a carbon content of 15.2% to 28.5% on a plurality of target substrates stacked at vertical intervals on a support member, which is placed in a process field inside a process container, the method comprising:

preparing the process field to be supplied with a silicon source gas, ammonia gas, and ethylene gas, respectively from first, second, and third gas distribution nozzles, such that each of which vertically extends along a side of the process field inside the process container and has a plurality of gas spouting holes formed thereon at vertical intervals over the process field to spout gas in lateral directions to form gas flows parallel with the target substrates on the support member; and repeating a unit cycle a plurality of times to laminate thin films respectively formed, thereby forming the SiCN film with a predetermined thickness, the unit cycle including in order:

performing supply of the silicon source gas as a pulse from the first gas distribution nozzle to the process field while suspending supplies of the ammonia gas and the ethylene gas;

then performing supply of the ethylene gas as a pulse from the third gas distribution nozzle to the process field while suspending supplies of the silicon source gas and the ammonia gas; and then performing supply of the ammonia gas as a pulse from the second gas distribution nozzle to the process field while suspending supplies of the silicon source gas and the ethylene gas; and then performing a purge operation of exhausting gas from the process field while suspending supplies of the silicon source gas, the ammonia gas, and the ethylene gas, wherein the unit cycle sets the silicon source gas at a flow rate within a range of 500 to 5,000 sccm, the ammonia gas at a flow rate within a range of 100 to 10,000 sccm, and the ethylene gas at a flow rate within a range of 100 to 5,000 sccm, with the flow rate of the ethylene gas not more than three times the flow rate of the silicon source gas, wherein the unit cycle does not turn any one of the silicon source gas, the ammonia gas, and the ethylene gas into plasma outside the process field during supply thereof to the process field, but heats the process field to a process temperature of 300 to 700° C. through the unit cycle and sets the process field at a process pressure of 13 Pa (0.1 Torr) to 1,330 Pa (10 Torr) when supplying each of the silicon source gas, the ammonia gas, and the ethylene gas, and wherein the unit cycle emits each of the pulses of the silicon source gas, the ammonia gas, and the ethylene gas only one time by a length of a single digit in units of second with the pulse of the ethylene gas longer than the pulse of the silicon source gas, such that each of the thin films formed by the unit cycle has a thickness of 0.048 to 0.13 nm.

2. The method according to claim 1, wherein the unit cycle further includes performing a purge operation of exhausting gas from the process field while suspending supplies of the silicon source gas, the ammonia gas, and ethylene gas, between said performing supply of the silicon source gas and said performing supply of the ethylene gas.

3. The method according to claim 1, wherein the unit cycle has the pulse of the ammonia gas longer than the pulse of the silicon source gas.

4. The method according to claim 1, wherein the silicon source gas contains at least one gas selected from the group consisting of dichlorosilane, hexachlorodisilane, monosilane, disilane, hexamethyldisilazane, tetrachlorosilane, disilylamine, trisilylamine, bistertialbutylaminosilane, and diisopropylaminosilane.

5. The method according to claim 1, wherein the process temperature is a temperature of 550 to 650° C.

6. The method according to claim 2, wherein the unit cycle further includes performing a purge operation of exhausting gas from the process field while suspending supplies of the silicon source gas, the ammonia gas, and the ethylene gas, between said performing supply of the ethylene gas and said performing supply of the ammonia gas.

7. The method according to claim 1, wherein the silicon source gas contains at least one gas selected from the group consisting of dichlorosilane, hexachlorodisilane, and tetrachlorosilane.

8. The method according to claim 1, wherein the silicon source gas is dichlorosilane gas.

\* \* \* \* \*